US009136302B2

(12) United States Patent
Wang et al.

(10) Patent No.: US 9,136,302 B2
(45) Date of Patent: Sep. 15, 2015

(54) APPARATUS FOR VERTICALLY INTEGRATED BACKSIDE ILLUMINATED IMAGE SENSORS

(71) Applicant: Taiwan Semiconductor Manufacturing Company, Ltd., Hsin-Chu (TW)

(72) Inventors: Tzu-Jui Wang, Fengshan (TW); Szu-Ying Chen, Toufen Township (TW); Jen-Cheng Liu, Hsin-Chu (TW); Dun-Nian Yaung, Taipei (TW); Ping-Yin Liu, Yonghe (TW); Lan-Lin Chao, Sindian (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/136,996

(22) Filed: Dec. 20, 2013

(65) Prior Publication Data

US 2014/0113398 A1 Apr. 24, 2014

Related U.S. Application Data

(62) Division of application No. 13/458,812, filed on Apr. 27, 2012, now Pat. No. 8,629,524.

(51) Int. Cl.
*H01L 21/00* (2006.01)
*H01L 27/146* (2006.01)

(52) U.S. Cl.
CPC ...... *H01L 27/14683* (2013.01); *H01L 27/1469* (2013.01); *H01L 27/14618* (2013.01); *H01L 27/14634* (2013.01); *H01L 2924/0002* (2013.01)

(58) Field of Classification Search
CPC ............. H01L 27/14634; H01L 27/14683; H01L 27/1469; H01L 23/4012; H01L 23/481
USPC .............. 438/67, 64; 257/432, 440, 447, 777, 257/E27.132
See application file for complete search history.

(56) References Cited

U.S. PATENT DOCUMENTS

| | | | |
|---|---|---|---|
| 7,119,322 | B2 | 10/2006 | Hong |
| 7,336,808 | B2 | 2/2008 | Mizuno et al. |
| 7,470,893 | B2 | 12/2008 | Suzuki et al. |
| 7,495,206 | B2 | 2/2009 | Park |
| 7,745,860 | B2 | 6/2010 | Inoue et al. |
| 7,965,329 | B2 | 6/2011 | McCarten et al. |
| 8,049,256 | B2 | 11/2011 | Guidash |
| 8,325,221 | B2 | 12/2012 | Lee |

(Continued)

FOREIGN PATENT DOCUMENTS

| | | |
|---|---|---|
| EP | 1617480 A2 | 1/2006 |
| JP | 2003232679 A | 8/2003 |

(Continued)

*Primary Examiner* — Tu-Tu Ho
(74) *Attorney, Agent, or Firm* — Slater & Matsil, L.L.P.

(57) ABSTRACT

A backside illuminated image sensor comprises a photodiode and a first transistor located in a first chip, wherein the first transistor is electrically coupled to the photodiode. The backside illuminated image sensor further comprises a second transistor formed in a second chip and a plurality of logic circuits formed in a third chip, wherein the second chip is stacked on the first chip and the third chip is stacked on the second chip. The logic circuit, the second transistor and the first transistor are coupled to each other through a plurality of boding pads and through vias.

20 Claims, 22 Drawing Sheets

(56) References Cited

U.S. PATENT DOCUMENTS

| | | |
|---|---|---|
| 8,558,292 B2 | 10/2013 | Guidash |
| 8,629,524 B2 | 1/2014 | Wang et al. |
| 2003/0214595 A1 | 11/2003 | Mabuchi |
| 2004/0263668 A1 | 12/2004 | Kim et al. |
| 2005/0110159 A1 | 5/2005 | Oh et al. |
| 2005/0133021 A1 | 6/2005 | Kobayashi |
| 2005/0275418 A1 | 12/2005 | Chong et al. |
| 2006/0146233 A1 | 7/2006 | Park |
| 2006/0278992 A1* | 12/2006 | Trezza et al. ............. 257/777 |
| 2007/0045836 A1* | 3/2007 | Kwon et al. ............... 257/734 |
| 2007/0181780 A1 | 8/2007 | Suzuki et al. |
| 2008/0083939 A1 | 4/2008 | Guidash |
| 2008/0203452 A1 | 8/2008 | Moon et al. |
| 2008/0272464 A1* | 11/2008 | Do et al. .................. 257/620 |
| 2009/0200624 A1 | 8/2009 | Dai et al. |
| 2010/0013907 A1 | 1/2010 | Lee |
| 2010/0238334 A1* | 9/2010 | Takahashi ................. 348/305 |
| 2010/0248412 A1 | 9/2010 | Guidash |
| 2010/0276572 A1* | 11/2010 | Iwabuchi et al. ......... 250/208.1 |
| 2011/0121420 A1* | 5/2011 | Yang ........................ 257/432 |
| 2011/0159634 A1* | 6/2011 | Oshiki et al. ............. 438/73 |
| 2011/0163223 A1 | 7/2011 | Guidash |
| 2011/0260221 A1 | 10/2011 | Mao et al. |
| 2013/0068929 A1 | 3/2013 | Solhusvik et al. |
| 2013/0264467 A1 | 10/2013 | Hong et al. |
| 2013/0292548 A1 | 11/2013 | Agranov et al. |
| 2013/0320194 A1 | 12/2013 | Chen et al. |
| 2014/0042298 A1 | 2/2014 | Wan et al. |
| 2014/0042299 A1 | 2/2014 | Wan et al. |

FOREIGN PATENT DOCUMENTS

| | | |
|---|---|---|
| JP | 2003338615 A | 11/2003 |
| JP | 2006191081 A | 7/2006 |
| JP | 2007228460 A | 9/2007 |
| JP | 2008066410 A | 3/2008 |
| KR | 20040110296 A | 12/2004 |
| KR | 1020060011429 | 2/2006 |
| KR | 1020060011845 | 2/2006 |
| KR | 20070093450 A | 9/2007 |
| KR | 100825808 | 4/2008 |
| KR | 1020090065980 | 6/2009 |
| KR | 20090077904 A | 7/2009 |
| WO | 2004105137 A1 | 12/2004 |
| WO | 2006086512 A2 | 8/2006 |
| WO | 2008045356 A2 | 4/2008 |
| WO | 2012001911 A1 | 1/2012 |

\* cited by examiner

APPARATUS FOR VERTICALLY INTEGRATED BACKSIDE ILLUMINATED IMAGE SENSORS

This application is a divisional of U.S. patent application Ser. No. 13/458,812, entitled "Apparatus for Vertically Integrated Backside Illuminated Image Sensors," filed on Apr. 27, 2012, which application is incorporated herein by reference.

BACKGROUND

As technologies evolve, complementary metal-oxide semiconductor (CMOS) image sensors are gaining in popularity over traditional charged-coupled devices (CCDs) due to certain advantages inherent in the CMOS image sensors. In particular, a CMOS image sensor may have a high image acquisition rate, a lower operating voltage, lower power consumption and higher noise immunity. In addition, CMOS image sensors may be fabricated on the same high volume wafer processing lines as logic and memory devices. As a result, a CMOS image chip may comprise both image sensors and all the necessary logics such as amplifiers, A/D converters and the like.

CMOS image sensors are pixelated metal oxide semiconductors. A CMOS image sensor typically comprises an array of light sensitive picture elements (pixels), each of which may include transistors (switching transistor and reset transistor), capacitors, and a photo-sensitive element (e.g., a photo-diode). A CMOS image sensor utilizes light-sensitive CMOS circuitry to convert photons into electrons. The light-sensitive CMOS circuitry typically comprises a photo-diode formed in a silicon substrate. As the photo-diode is exposed to light, an electrical charge is induced in the photo-diode. Each pixel may generate electrons proportional to the amount of light that falls on the pixel when light is incident on the pixel from a subject scene. Furthermore, the electrons are converted into a voltage signal in the pixel and further transformed into a digital signal by means of an A/D converter. A plurality of periphery circuits may receive the digital signals and process them to display an image of the subject scene.

A CMOS image sensor may comprise a plurality of additional layers such as dielectric layers and interconnect metal layers formed on top of the substrate, wherein the interconnect layers are used to couple the photo diode with peripheral circuitry. The side having additional layers of the CMOS image sensor is commonly referred to as a front side, while the side having the substrate is referred to as a backside. Depending on the light path difference, CMOS image sensors can be further divided into two major categories, namely front-side illuminated (FSI) image sensors and back-side illuminated (BSI) image sensors.

In a FSI image sensor, light from the subject scene is incident on the front side of the CMOS image sensor, passes through dielectric layers and interconnect layers, and finally falls on the photo diode. The additional layers (e.g., opaque and reflective metal layers) in the light path may limit the amount of light absorbed by the photo diode so as to reduce quantum efficiency. In contrast, there is no obstruction from additional layers (e.g., metal layers) in a BSI image sensor. Light is incident on the backside of the CMOS image sensor. As a result, light can strike the photo diode through a direct path. Such a direct path helps to increase the number of photons converted into electrons.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the embodiments of the disclosure, and do not limit the scope of the disclosure.

The present disclosure will be described with respect to embodiments in a specific context, a vertically integrated backside illuminated image sensor. The embodiments of the disclosure may also be applied, however, to a variety of image sensors and semiconductor devices. Hereinafter, various embodiments will be explained in detail with reference to the accompanying drawings.

Figure 1:
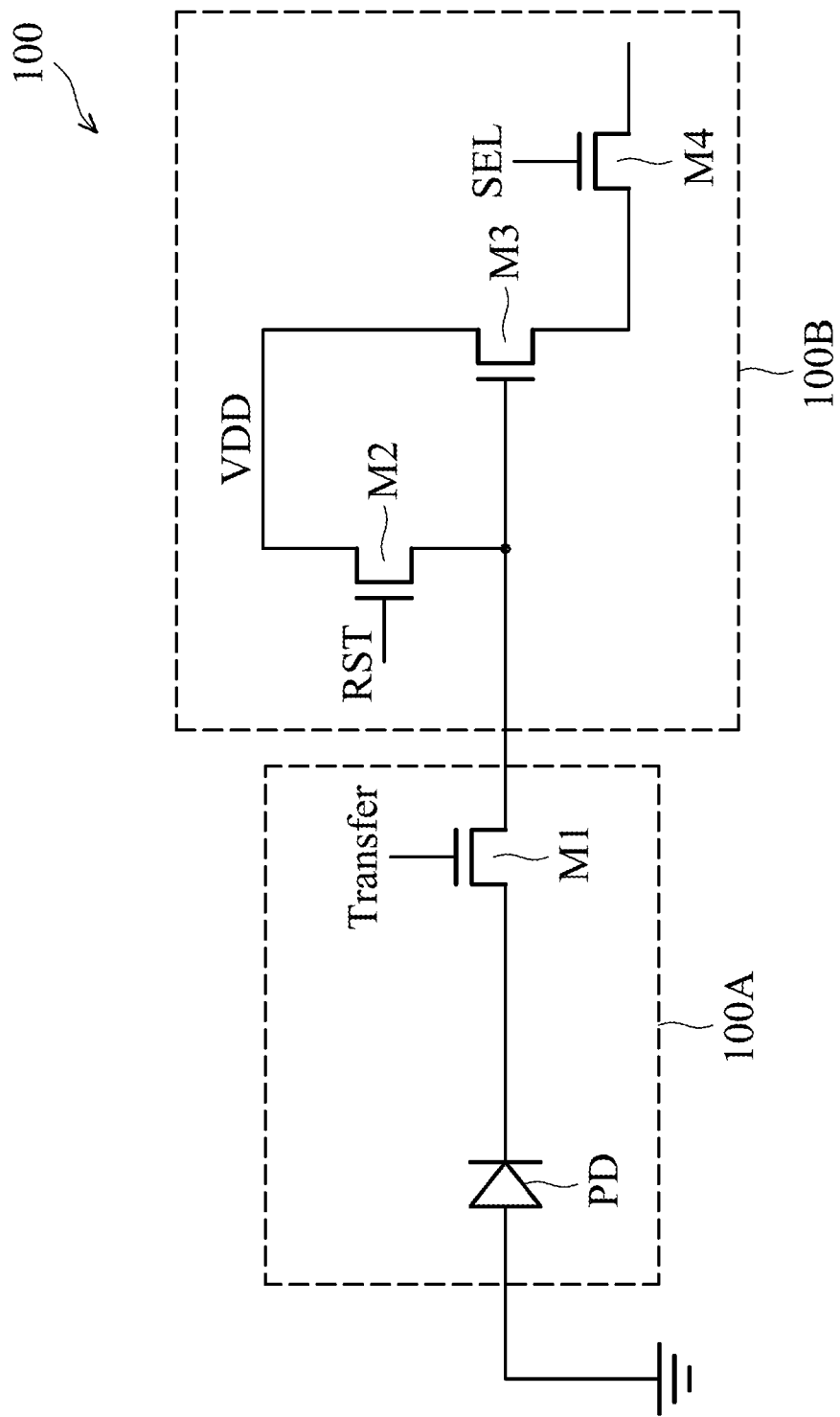
FIG. 1 illustrates a schematic diagram of a four-transistor backside illuminated image sensor in accordance with an embodiment.

FIG. 1 illustrates a schematic diagram of a four-transistor backside illuminated image sensor in accordance with an embodiment. The four-transistor backside illuminated image sensor 100 comprises a first portion 100A fabricated in a first wafer (not shown) and a second portion 100B fabricated in a second wafer (not shown). More particularly, the circuits in the first wafer are electrically coupled to the circuits in the second wafer by stacking the second wafer on top of the first wafer and bonding two wafers together through a plurality of interconnects such as bonding pads. The detailed description of the stacked die structure will be discussed below with respect to FIG. 2.

The first portion 100A comprises a photodiode PD and a first transistor M1 connected in series. In particular, the photodiode PD has an anode coupled to ground and a cathode coupled to a source of a first transistor M1. In accordance with an embodiment, the first transistor M1 is a transfer transistor and has a gate coupled to a transfer line. The drain of the first transistor M1 is coupled to the second portion 100B through a plurality of bonding pads (not shown but illustrated in FIG. 2).

The second portion 100B comprises a second transistor M2, a third transistor M3 and a fourth transistor M4. The drain of the first transistor M1 is coupled to a source of a second transistor M2 and a gate of the third transistor M3. The second transistor M2, which functions as a reset transistor, has a gate coupled to a reset line RST. A drain of the second transistor M2 is coupled to a voltage source VDD. The second transistor M2 is used to preset the voltage at the gate of the third transistor M3. A drain of the third transistor M3 is coupled to the voltage source VDD, and a source of the third transistor M3 is coupled to the fourth transistor M4. The third transistor M3 is a source follower providing a high impedance output for the four-transistor image sensor 100. The fourth transistor M4 functions as a select transistor. A gate of the fourth transistor M4 is coupled to a select line SEL. A source of the fourth transistor M4 is coupled to an output line, which is coupled to data processing circuits (not shown).

In operation, light strikes the photo active region of the photodiode PD. As a consequence, the photodiode PD generates an electrical charge proportional to the intensity or brightness of light. The electrical charge is transferred by enabling the first transistor M1 through a transfer signal applied to the gate of the first transistor M1. The electrical charge transferred from the photodiode PD by the first transistor M1 enables the third transistor M3, thereby allowing an electrical charge proportional to the charge generated by the photodiode PD to pass from the voltage source VDD through the third transistor M3 to the fourth transistor M4. When sampling is desired, the select line SEL is enabled, allowing the electrical charge to flow through the fourth transistor M4 to the data process circuits (not shown) coupled to the output of the fourth transistor M4.

It should be noted that FIG. 1 illustrates a schematic diagram of a single pixel in a backside illuminated image sensor. The schematic diagram of the pixel illustrated in FIG. 1 may be duplicated and circuitry may be added to provide a backside illuminated image sensor with multiple pixels. It should further be noted while FIG. 1 illustrates a pixel in a four-transistor structure, a person skilled in art will recognize that the four-transistor diagram is merely an example, which should not unduly limit the scope of the claims. One of ordinary skill in the art would recognize many variations, alternatives, and modifications. For example, various embodiments may include but not limited to three-transistor pixel, five-transistor pixel and the like.

Figure 2:
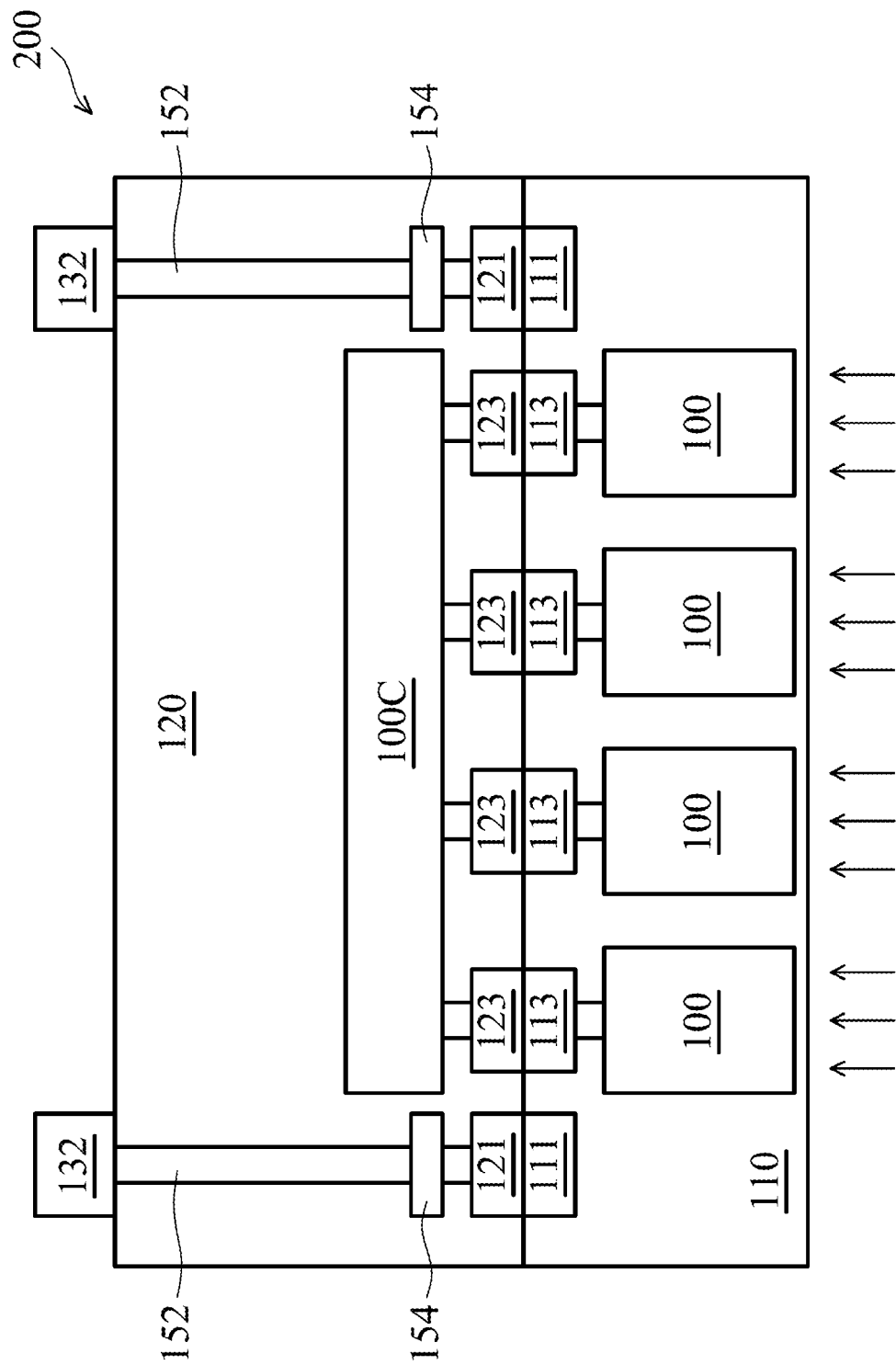
FIG. 2 illustrates a cross sectional view of a backside illuminated image sensor in accordance with an embodiment.

FIG. 2 illustrates a cross sectional view of a backside illuminated image sensor in accordance with an embodiment. The backside illuminated image sensor 200 comprises four pixels. Each pixel comprises a first portion 100A and a second portion 100B. Both the first portion 100A and the second portion 100B can be collectively called an image sensor 100. As shown in FIG. 2, the image sensor 100 is embedded in a first semiconductor wafer 110.

As shown in FIG. 2, a second semiconductor wafer 120 is stacked on top of the first semiconductor wafer 110. A plurality of bonding pads are formed in the first semiconductor wafer 110 and the second semiconductor wafer 120 respectively. Furthermore, the bonding pads located at a first side of the second semiconductor wafer 120 (e.g., bonding pad 123) are aligned face-to-face with their corresponding bonding pads located at the first semiconductor wafer 110 (e.g., bonding pad 113). The first semiconductor wafer 110 and the second semiconductor wafer 120 are bonded together through suitable bonding techniques such as direct bonding. The direct bonding process will be described below with respect to FIG. 8.

In accordance with an embodiment, the bonding pads shown in FIG. 2 may be circular in shape. The diameter of the bonding pads (e.g., bonding pad 113) is less than the pitch of the image sensor pixel (e.g., first portion 110A). However, the diameter of the bonding pads can be greater than the pitch of the image sensor pixel. For example, adjacent image sensor pixels' bonding pads may be placed at different rows to form staggering bonding pads. Such staggering bonding pads may allow bonding pads having a diameter more than the pitch of the image sensor pixel.

The second semiconductor wafer 120 may comprise a logic circuit 100C. The logic circuit 100C may be an analog-to-digital converter. However, the logic circuit 100C is also merely representative of the many types of functional circuits that may be utilized within a backside illuminated image sensor. For example, while the logic circuit 100C may be a data processing circuit, various embodiments may also include other circuits connected to a backside illuminated image sensor, such as a memory circuit, a bias circuit, a reference circuit and the like.

The second semiconductor wafer 120 may comprise a plurality of through silicon vias 152. The through silicon vias 152 may be formed through the second semiconductor wafer 120 with suitable photolithography and etching techniques. Generally, these photolithography techniques involve depositing a photoresist material, which is masked, exposed, and developed to expose portions of the wafer 120 that are to be removed. The remaining photoresist material protects the underlying material from subsequent processing steps, such as etching.

The etching process may generate a plurality of openings. In accordance with an embodiment, the openings have a diameter in a range from about 10 um to about 100 um. According to the through silicon via fabrication process, the fabrication steps may include depositing a seed layer, plating conductive materials on the seed layer and applying a chemical mechanical polishing (CMP) process.

The logic circuit 100C may be coupled to a plurality of input/output terminals such as aluminum copper pads 132. As shown in FIG. 2, an aluminum copper pad 132 is formed on a second side of the second semiconductor wafer 120. The aluminum copper pad 132 may be electrically coupled to the logic circuit 100C through a conductive path formed by through silicon vias 152 and interconnect metal lines 154. In comparison with traditional backside illuminated image sensors having input/output terminals formed adjacent to photodiodes, the structure shown in FIG. 2 can further reduce the form factor of a backside illuminated image sensor by forming the aluminum copper pads 132 on the second side of the second wafer 120. One advantageous feature of having input/output terminals formed on the second wafer 120 is the density as well as quantum efficiency of the backside illuminated image sensor 200 can be improved as a result.

Figure 3:
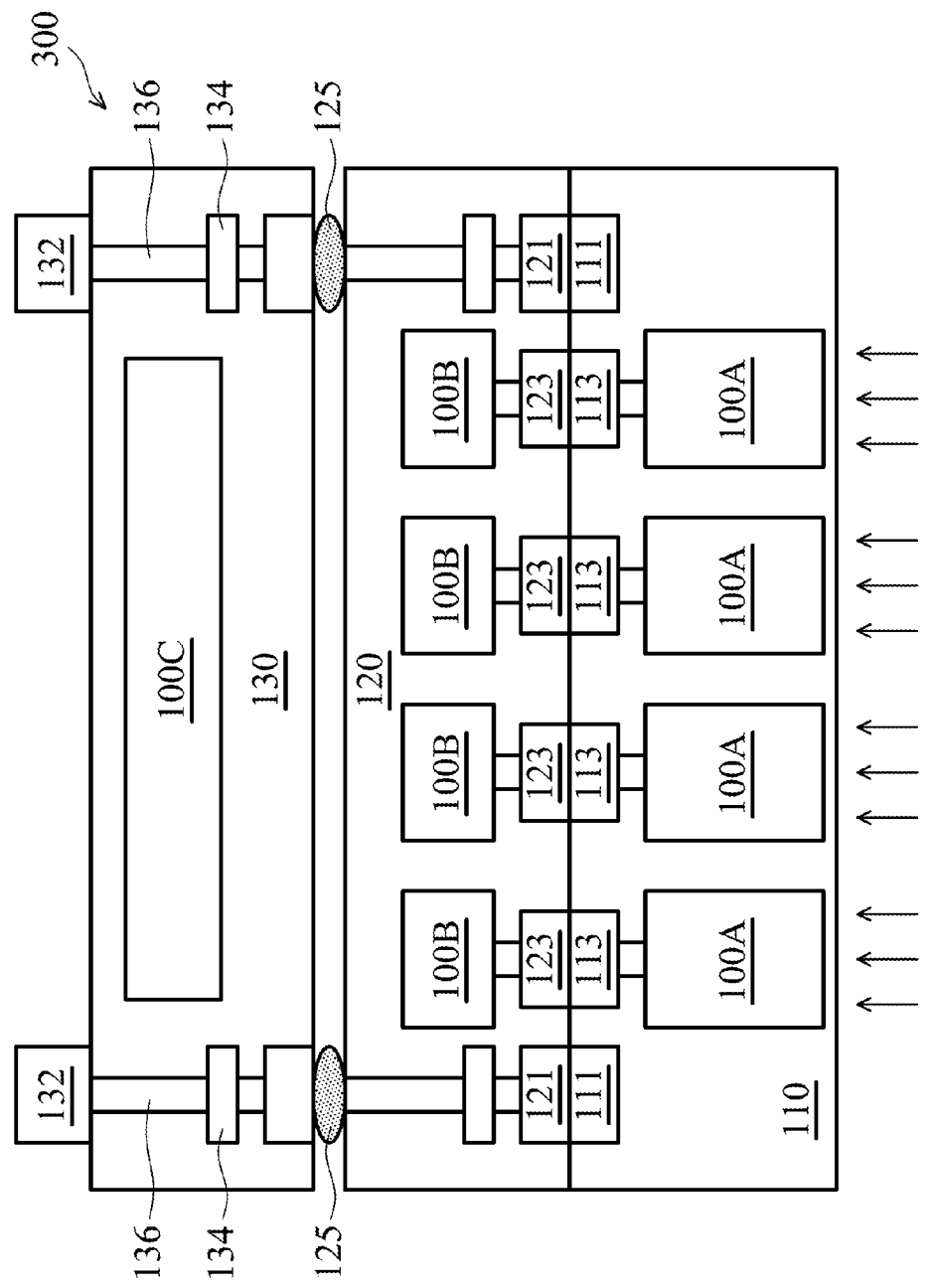
FIG. 3 illustrates a cross sectional view of a backside illuminated image sensor in accordance with another embodiment.

FIG. 3 illustrates a cross sectional view of a backside illuminated image sensor in accordance with another embodiment. The backside illuminated image sensor 300 is similar to the backside illuminated image sensor 200 shown in FIG. 2 except that the logic circuit 100C is formed in a third wafer 130. As shown in FIG. 3, the third wafer 130 is stacked on top of the second wafer 120. In particular, the first side of the third wafer 130 is coupled to the second side of the second wafer 120 through a plurality of interconnect components 125. In accordance with an embodiment, the interconnect components 125 may be implemented by a plurality of micro bumps.

The logic circuit 100C may be coupled to a plurality of input/output terminals 132. In accordance with an embodiment, the input/output terminals 132 may be a plurality of aluminum copper pads. As shown in FIG. 3, an aluminum copper pad 132 is formed on a second side of the third semiconductor wafer 130. The aluminum copper pad 132 may be electrically coupled to the logic circuit 100C through a conductive path formed by through silicon vias 136 and interconnect metal lines 134. On the other hand, the aluminum copper pad 132 also provides a signal channel for the circuits of the second wafer 120. As shown in FIG. 3, such a signal channel is formed by through silicon vias 136 in the third wafer 130, micro bumps 125 formed between the second wafer 120 and the third wafer 130 and through silicon vias in the second wafer 120.

Figure 4:
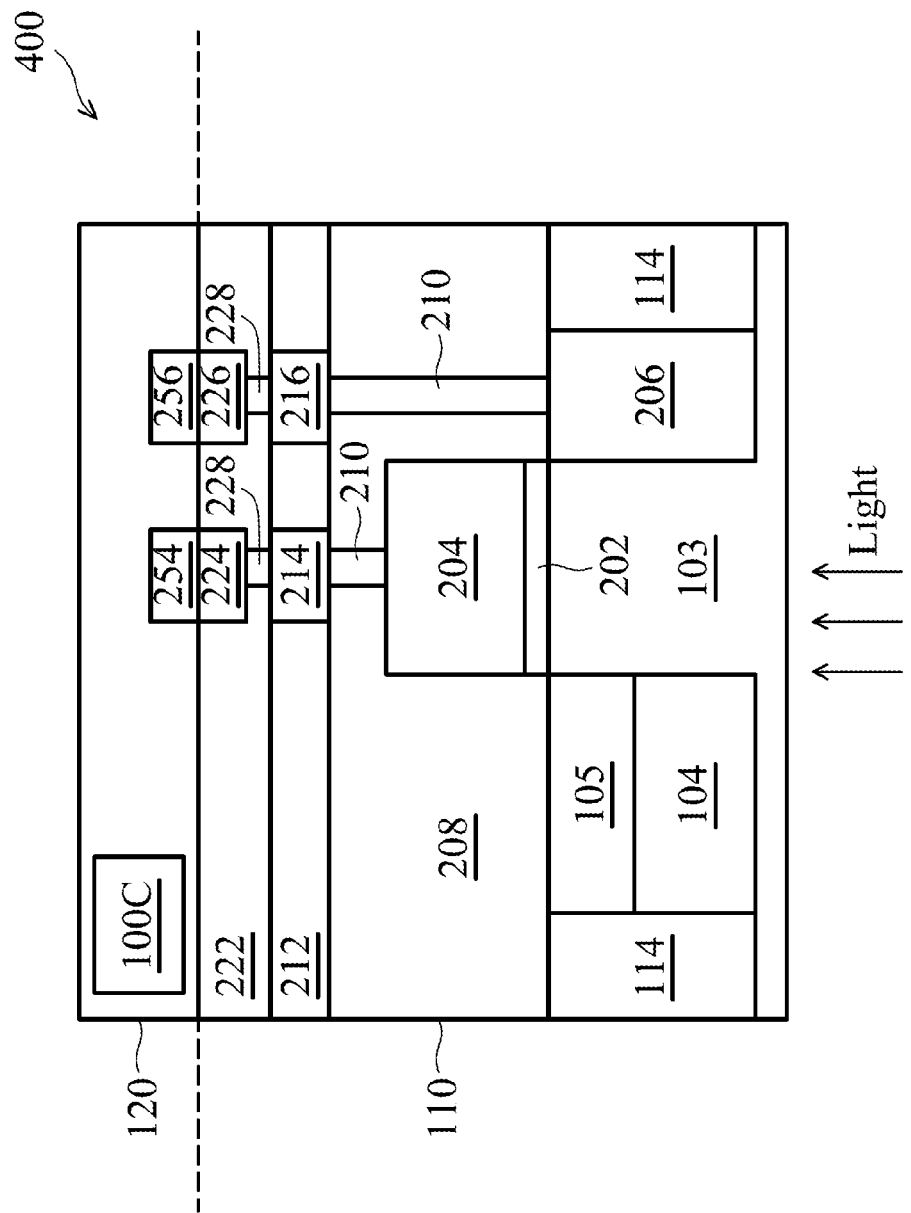
FIG. 4 illustrates in detail a cross sectional view of a pixel and its corresponding logic circuits of the backside illuminated image sensor shown in FIG. 2 in accordance with an embodiment.

FIG. 4 illustrates in detail a cross sectional view of a pixel and its corresponding logic circuits of the backside illuminated image sensor 200 shown in FIG. 2 in accordance with an embodiment. The backside illuminated image sensor 400 is formed in a stacked semiconductor structure comprising a first semiconductor wafer 110 and a second semiconductor wafer 120. The first semiconductor wafer 110 is fabricated by CMOS process techniques known in the art. In particular, the first semiconductor wafer 110 comprises an epitaxial layer over a silicon substrate. According to the fabrication process of backside illuminated image sensors, the silicon substrate has been removed in a backside thinning process until the epitaxial layer is exposed. As shown in FIG. 4, a portion of epitaxial layer 103 remains. A p-type photo active region 105 and an n-type photo active region 104 are formed in the remaining epitaxial layer 103.

The photo active regions such as the p-type photo active region 105 and the n-type photo active region 104 may form a PN junction, which functions as a photodiode corresponding to the photodiode PD shown in FIG. 1. In accordance with an embodiment, the photo active regions (e.g., the n-type photo active region 104 and p-type photo active region) are formed on an epitaxial layer 103 grown from a p-type semiconductor substrate (not shown).

The first semiconductor wafer 110 further comprises an isolation region 114 formed in the epitaxial layer 103. As shown in FIG. 4, the photo active regions 104 and 105 are enclosed by the isolation regions. In particular, the isolation regions help to prevent crosstalk and interference from adjacent pixels (not shown). In accordance with an embodiment, the isolation region 114 may be formed of P-type materials such as boron, BF2 and the like. In addition, the isolation region 114 may comprise a shallow trench isolation (STI) structure (not shown). In accordance with an embodiment, the isolation region 114 has a doping concentration of about $10^{12}/cm^3$. The isolation region 114 has a doping depth in a range from about 0 um to about 2 um.

The first semiconductor wafer 110 may comprise a transistor corresponding to the first transistor M1 of FIG. 1. The transistor includes a gate electrode 204. In particular, the transistor may generate a signal related to the intensity or brightness of light that impinges on the photo active regions 104 and 105. In accordance with an embodiment, the transistor may be a transfer transistor. However, the transistor may be an example of the many types of functional transistors that may be utilized within a backside illuminated image sensor. For example, while the transistor illustrated in FIG. 4 is a transfer transistor, various embodiments may include other transistors located within the backside illuminated image sensor 300, such as a reset transistor, a source follower transistor or a select transistor. All suitable transistors and configurations that may be utilized in an image sensor are fully intended to be included within the scope of the embodiments.

The transistor shown in FIG. 4 comprises a gate dielectric layer 202 formed over the epitaxial layer 103 and a gate electrode 204 formed over the gate dielectric layer 202. The gate dielectric layer 202 and gate electrode 204 may be formed and patterned by any suitable process known in the art. The gate dielectric layer 202 may be a high-K dielectric material, such as silicon oxide, silicon oxynitride, silicon nitride, an oxide, a nitrogen-containing oxide, aluminum oxide, lanthanum oxide, hafnium oxide, zirconium oxide, hafnium oxynitride, a combination thereof, or the like.

In accordance with an embodiment, the gate dielectric layer 202 comprises an oxide layer, which may be formed by any oxidation process, such as wet or dry thermal oxidation or by chemical vapor deposition (CVD) techniques using tetra-ethyl-ortho-silicate (TEOS) and oxygen as a precursor.

The gate electrode 204 may comprise a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, or a combination thereof. In accordance with an embodiment, the gate electrode 204 may be formed of poly-silicon by depositing doped or undoped poly-silicon by low-pressure chemical vapor deposition (LPCVD).

A drain/source region 206 may be formed in the epitaxial layer 103 on an opposing side of the gate dielectric 202 from the photo active regions 104 and 105. In accordance with an embodiment, the drain/source region 206 may be formed by implanting appropriate n-type dopants such as phosphorous, arsenic, antimony or the like.

As shown in FIG. 4, an inter-layer dielectric (ILD) layer 208 is formed over the substrate including the photodiode. The ILD layer 208 may comprise a material such as boron phosphorous silicate glass (BPSG), although any suitable dielectrics may be used for either layer. The ILD layer 208 may be formed using a process such as PECVD, although other processes, such as LPCVD, may alternatively be used.

There may be a plurality of contacts 210 coupled to the gate electrode 204 and the drain/source 206. The contacts 210 may be formed through the ILD layer 208 with suitable photolithography and etching techniques. Generally, these photolithography techniques involve depositing a photoresist material, which is masked, exposed, and developed to expose portions of the ILD layer 208 that are to be removed. The remaining photoresist material protects the underlying material from subsequent processing steps, such as etching.

The contacts 210 may comprise a barrier/adhesion layer (not shown) to prevent diffusion and provide better adhesion for the contacts 210. In an embodiment, the barrier layer is formed of one or more layers of titanium, titanium nitride, tantalum, tantalum nitride, or the like. The barrier layer may be formed through chemical vapor deposition, although other techniques could alternatively be used.

The contacts 210 may be formed of any suitable conductive material, such as a highly-conductive, low-resistive metal, elemental metal, transition metal, or the like. In accordance with an embodiment, the contacts 210 are formed of tungsten, although other materials, such as copper, could alternatively be utilized. In an embodiment in which the contacts 210 are formed of tungsten, the contacts 210 may be deposited by CVD techniques known in the art, although any method of formation could alternatively be used.

After the contacts 210 are formed, there may be a plurality of interconnect layers formed over the ILD layer 208. For simplicity, only two interconnect layers are illustrated to represent the inventive aspects of various embodiments. A first interconnect layer 212 is formed over the ILD layer 208. As shown in FIG. 4, the first interconnect layer 212 may comprise metal lines 214 and 216 coupled to the gate electrode 204 and the drain/source region 206 respectively. The metal lines 214 and 216 may be made through any suitable formation process (e.g., lithography with etching, damascene, dual damascene, or the like) and may be formed using suitable conductive materials such as copper, aluminum, aluminum alloys, copper alloys or the like.

A second interconnect layer 222 is formed over the first interconnect layer 212. The second interconnect layer 222 may include bonding pads 224 and 226. In accordance with an embodiment, the bonding pads 224 and 226 are formed of conductive materials such as copper and the like. As shown in FIG. 3, the bonding pads 224 and 226 are electrically coupled to metal lines 214 and 216 respectively through vias 228.

The second semiconductor wafer 120 shown in FIG. 4 is stacked on top of the first semiconductor wafer 110. The second semiconductor wafer 120 may comprise the logic circuit 100C. The logic circuit 100C may comprise a variety of logic circuits suitable for image processing. In accordance with an embodiment, the second semiconductor wafer 120 comprises digital circuits. In order to further reduce form factor and increase circuit density, the second semiconductor wafer 120 may be fabricated on a smaller process node.

The second semiconductor wafer 120 further comprises bonding pads 254 and 256. As shown in FIG. 4, the bonding pads 254 and 256 are aligned face-to-face with the bonding pads 224 and 226 respectively. Furthermore, the bonding pads such as 254 and the bonding pads such as 224 are bonded together to form a uniform bonded structure. In other words, the bonding pads such as 254 and 224 are the bonding medium of the stacked semiconductor structure. The bonding process of the first semiconductor wafer 110 and the second semiconductor wafer 120 will be described in detail below with respect to FIG. 8.

An advantageous feature of the stacked semiconductor structure shown in FIG. 4 is that the photodiode and logic circuits such as data processing circuits can be fabricated with different process nodes. For example, logic circuits can be fabricated in a smaller process node so that the cost and density of logic circuits can be improved accordingly. In addition, the photodiode and the logic circuits are vertically integrated into a three dimensional chip. Such a three dimensional chip helps to further reduce form factor. Furthermore, a three dimensional chip based image sensor helps to cut power consumption and prevent parasitic capacitance interference.

Figure 5:
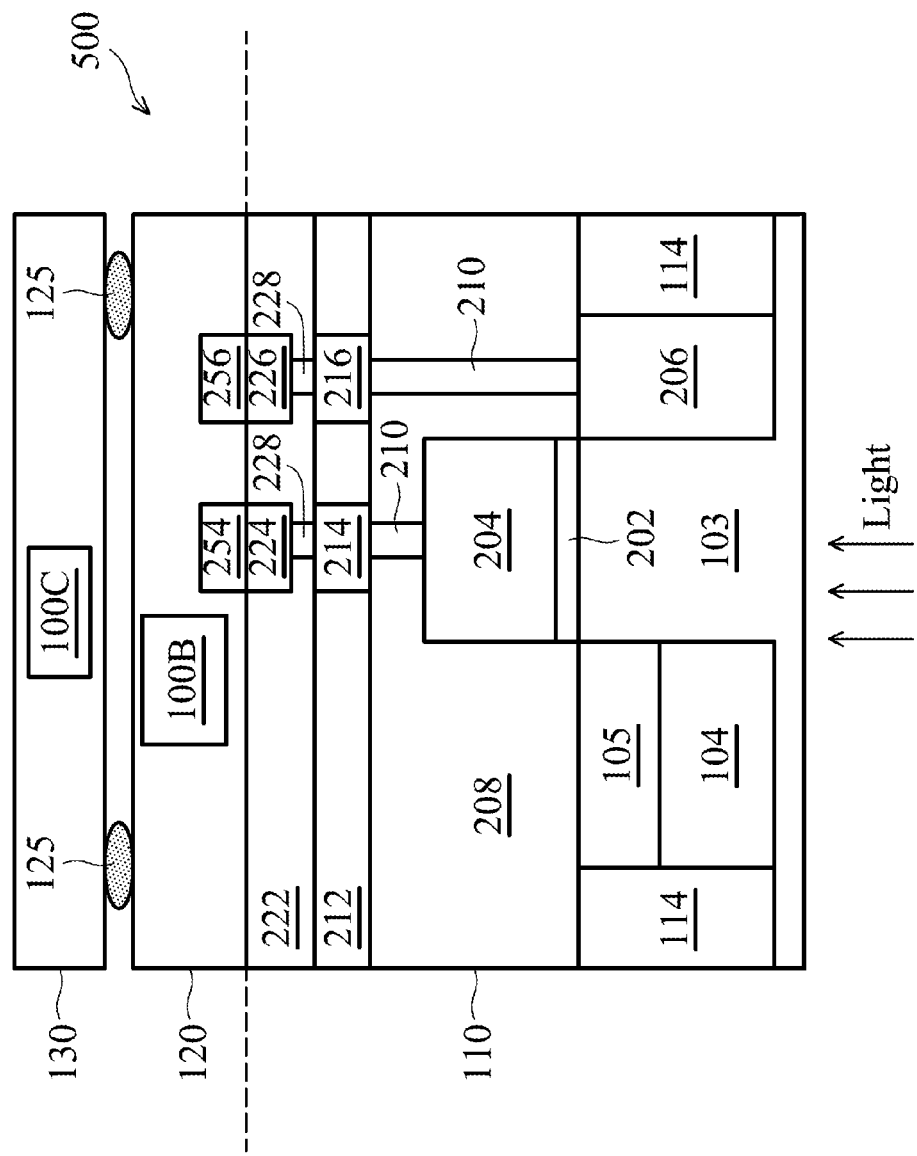
FIG. 5 illustrates in detail a cross sectional view of a pixel and its corresponding logic circuits of the backside illuminated image sensor shown in FIG. 3 in accordance with an embodiment.

FIG. 5 illustrates in detail a cross sectional view of a pixel and its corresponding logic circuits of the backside illuminated image sensor 300 shown in FIG. 3 in accordance with an embodiment. The backside illuminated image sensor 500 is similar to the backside illuminated image sensor 400 shown in FIG. 4 except that the logic circuit 100C is formed in a third wafer 130. As shown in FIG. 5, the third wafer 130 is stacked on top of the second wafer 120. There may be a plurality of interconnect components 125 formed between the second wafer 120 and the third wafer 130.

Figure 6:
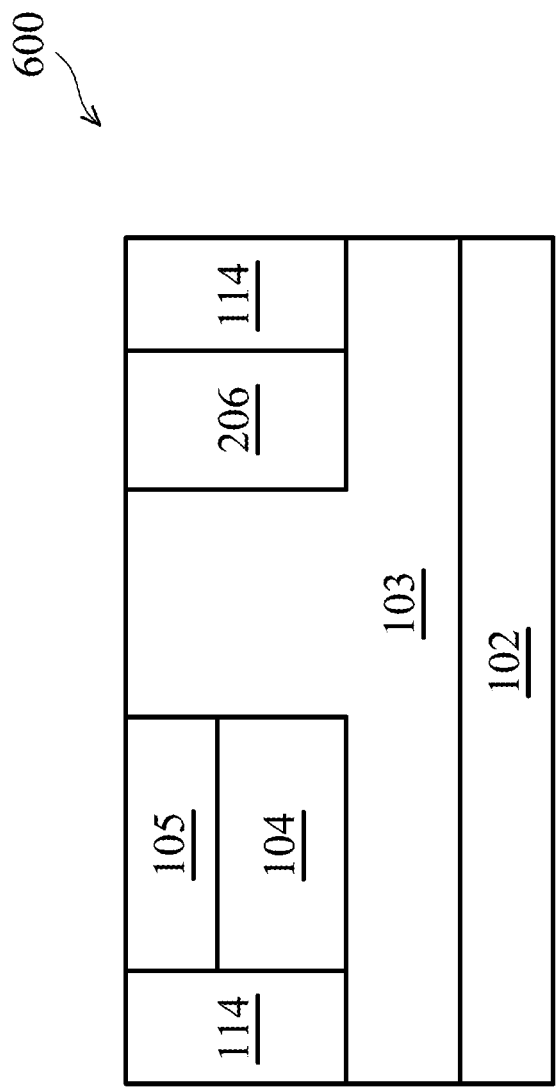
FIG. 6 is a cross sectional view of a backside illuminated image sensor wafer when a front side ion implantation process is performed on a substrate in accordance with an embodiment.

FIGS. 6-12 illustrate a method of fabricating a backside illuminated image sensor in accordance with an embodiment. FIG. 6 is a cross sectional view of a backside illuminated image sensor wafer when a front side ion implantation process is performed on a substrate in accordance with an embodiment. The backside illuminated image sensor wafer 600 comprises a substrate 102 having a first conductivity. In accordance with an embodiment, the substrate 102 is a p-type substrate. The substrate 102 may be formed of silicon, germanium, silicon germanium, graded silicon germanium, semiconductor-on-insulator, carbon, quartz, sapphire, glass, or the like, and may be multi-layered (e.g., strained layers). A p-type epitaxial layer 103 is grown on the p-type substrate 102.

The photo active regions shown in FIG. 6 may be implemented by an ion implantation or a diffusion process known in the art. In accordance with an embodiment, p-type impurity ions are implanted from the front side of the wafer into the p-type epitaxial layer 103 to form the p-type photo active region 105. In addition, n-type impurity ions are implanted from the front side of the wafer to form the n-type photo active region 104.

The backside illuminated image sensor wafer 600 may comprise a plurality of pixels (not shown), each of which comprises a PN junction formed by a p-type photo active region (e.g., photo active region 105) and an n-type photo active region (e.g., photo active region 104). In order to prevent crosstalk and interference between adjacent pixels, an isolation region 114 is employed to enclose the photo active regions 104 and 105.

In accordance with an embodiment, the isolation region 114 may comprise a STI structure (not shown). The STI structure may be formed by etching a portion of the substrate to form a trench and filling the trench with oxide and/or other dielectric materials. The isolation region 114 helps to prevent reflected light from adjacent pixels from reaching the photo active region 104 and the photo active region 105.

Figure 7:
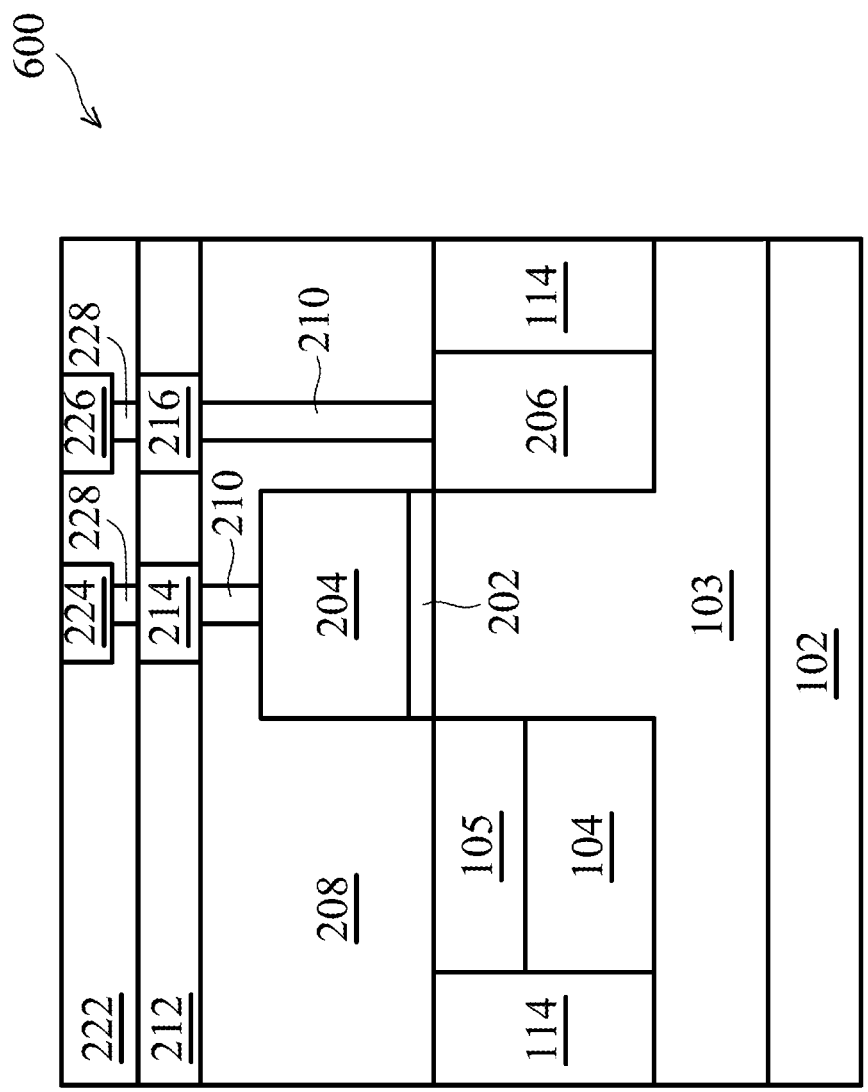
FIG. 7 illustrates a cross sectional view of the semiconductor device shown in FIG. 6 after additional front side layers have been formed over the photo active region in accordance with an embodiment.

FIG. 7 illustrates a cross sectional view of the semiconductor device shown in FIG. 6 after additional front side layers have been formed over the photo active region in accordance with an embodiment. An ILD layer 208 is formed over the epitaxial layer 103. A first interconnect layer 212 may be formed over the ILD layer 208. A second interconnect layer 222 is formed over the first interconnect layer 212. The metal lines of the first interconnect layer 212 and the bonding pads of the second interconnect layer 222 can be patterned by plasma etching or a damascene process and may be formed of any conductive material suitable for a particular application. Materials that may be suitable include, for example, aluminum, copper, doped polysilicon or the like. Contacts 210 and vias 228 may be formed to provide electrical connectivity between the interconnect layer 212 and underlying circuitry such as gate electrode 204 and the drain/source region 206.

Figure 8:
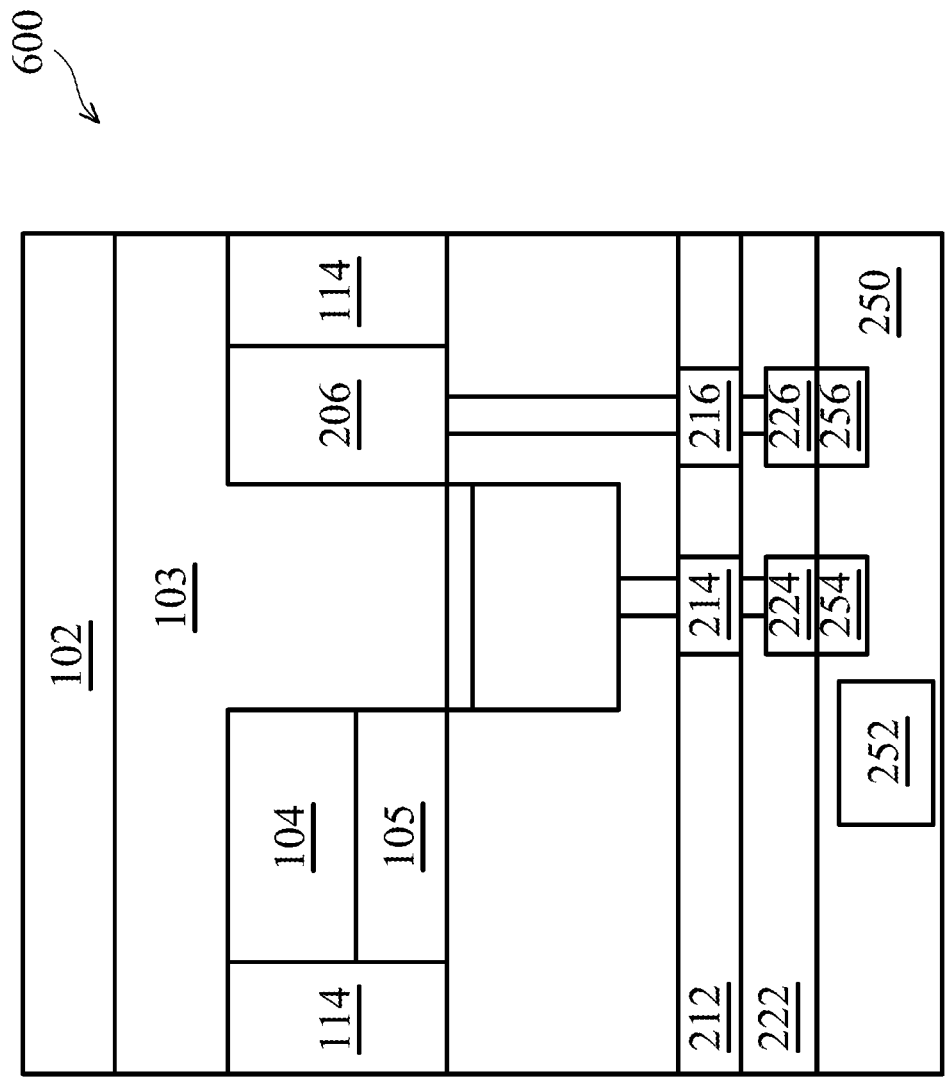
FIG. 8 is a cross sectional view of a backside illuminated image sensor wafer after the wafer is flipped and bonded on a carrier in accordance with an embodiment.

FIG. 8 is a cross sectional view of a backside illuminated image sensor wafer after the wafer is flipped and bonded on a carrier 250 in accordance with an embodiment. Once the interconnect layers 212 and 222 are formed, the backside illuminated image sensor wafer 600 is flipped and further bounded on a carrier 250. In particular, the front side of the backside illuminated image sensor wafer 600 faces up toward the front side of the carrier 250. In accordance with an embodiment, the carrier 250 is a semiconductor wafer comprising logic circuits 252 of the backside illuminated image sensor. In particular, various logic circuits such as reset transistors of pixel circuitry, memory circuits, data processing circuits and the like are fabricated in the carrier 250.

Various bonding techniques may be employed to achieve bonding between the backside illuminated image sensor wafer 200 and the carrier 250. In accordance with an embodiment, suitable bonding techniques may include direct bonding, hybrid bonding and the like. In accordance with an embodiment, through a bonding structure such a bonding chuck (not shown), the backside illuminated image sensor wafer 600 is stacked on top of the carrier 250 in a chamber (not shown). In particular, the bonding pads (e.g., bonding pads 224 and 226) of the backside illuminated image sensor wafer 600 are aligned face-to-face with their corresponding bonding pads (e.g., bonding pads 254 and 256) located at the carrier 250.

A thermo-compression process may be performed on the stacked wafer structure. Such a thermo-compression process may lead to copper inter-diffusion. More particularly, the copper atoms of the bonding pads acquire enough energy to diffuse between two adjacent bonding pads. As a result, a homogeneous copper layer is formed between two adjacent bonding pads. Such a homogeneous copper layer helps the bonding pads such as 224 and the bonding pads such as 254 form a uniform bonded feature. The uniform bonded feature establishes a conductive path between the backside illuminated image sensor wafer 600 and the carrier wafer 250. In addition, the uniform bonded feature also provides a mechanical bond to hold the backside illuminated image sensor wafer 600 and the carrier wafer 250.

According to an embodiment, the alignment accuracy between two boding pads is less than 0.9 um. The alignment accuracy can be defined by an X direction shift, a Y direction shift and a rotation angle. In accordance with an embodiment, the X direction shift between two bonding pads is less than 0.8 um. The Y direction shift between two bonding pads is less than 0.8 um. The rotation angle between two bonding pads is in a range from about one degree to about two degrees.

A post bonding anneal process may be performed on the stacked semiconductor structure in a chamber with inert gases such as argon, nitrogen, helium and the like. The stacked semiconductor structure is baked for approximately three hours at a temperature more than 150 degrees. As a result, the bonding pads of the backside illuminated image sensor wafer and the bonding pads of the carrier 250 are reliably bonded together through the post bonding anneal process.

The carrier 250 includes a variety of functional circuits. Through the bonding process, the functional circuits are coupled to the image sensor pixel so that electrons generated by the image sensor pixel can be processed by the functional circuits. In addition, the carrier 250 may provide sufficient mechanical support to resist forces due to a grinding step of a thinning process. The thinning process will be described below with respect to FIG. 9.

Figure 9:
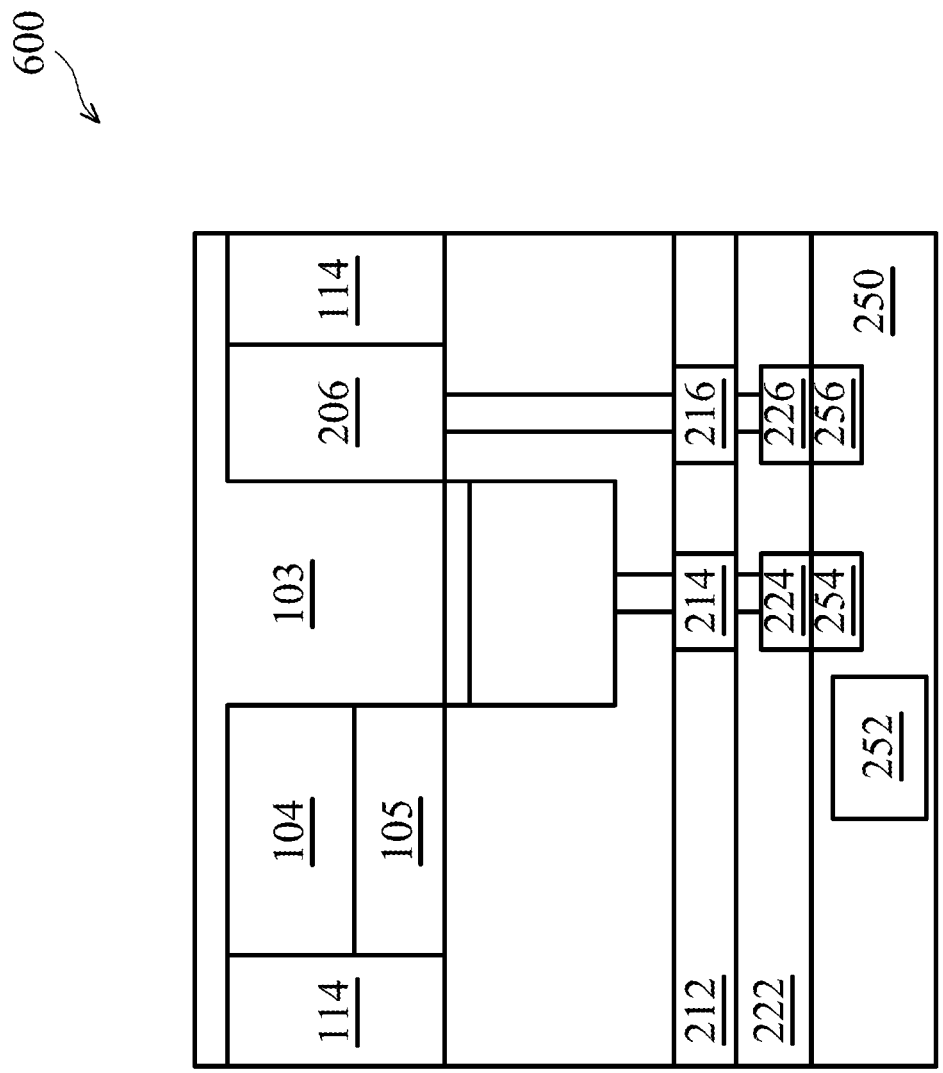
FIG. 9 is a cross sectional view of the backside illuminated image sensor wafer illustrated in FIG. 8 after a thinning process has been applied to the backside of the wafer in accordance with an embodiment.

FIG. 9 is a cross sectional view of the backside illuminated image sensor wafer illustrated in FIG. 8 after a thinning process has been applied to the backside of the wafer in accordance with an embodiment. According to the fabrication processes of backside illuminated image sensors, the substrate is thinned until the substrate 102 (illustrated in FIG. 8) is removed and the epitaxial layer 103 is exposed. More particularly the backside the substrate (e.g., the remaining of the p-type epitaxial layer 103) of the backside illuminated image sensor wafer 600 may be thinned to a thickness in a range from about 2 um to about 2.15 um. Such a thin substrate layer allows light to pass through the substrate (not shown) and hit photo diodes embedded in the substrate without being absorbed by the substrate.

The thinning process may be implemented by using suitable techniques such as grinding, polishing and/or chemical etching. In accordance with an embodiment, the thinning process may be implemented by using a chemical mechanical polishing (CMP) process. In a CMP process, a combination of etching materials and abrading materials are put into contact with the back side of the substrate and a grinding pad (not shown) is used to grind away the back side of the substrate until a desired thickness is achieved.

Figure 10:
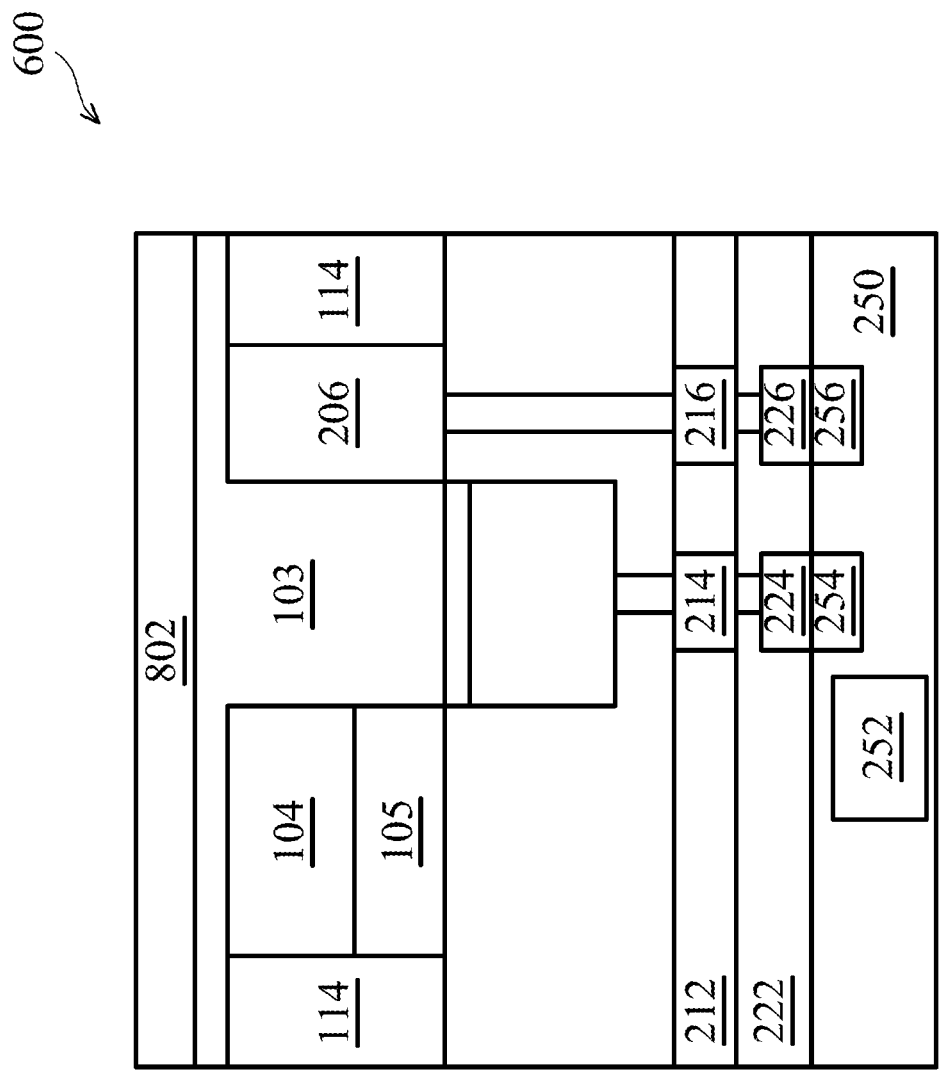
FIG. 10 is a cross sectional view of the backside illuminated image sensor wafer illustrated in FIG. 9 after a thin p+ ion layer has been applied to the backside of the wafer in accordance with an embodiment.

FIG. 10 is a cross sectional view of the backside illuminated image sensor wafer illustrated in FIG. 9 after a thin p+ ion layer has been applied to the backside of the wafer in accordance with an embodiment. Furthermore, the thin p+ ion layer 802 may be formed on the backside of the thinned substrate to increase the number of photons converted into electrons. The p+ ion implantation process may cause crystal defects. In order to repair crystal defects and activate the implanted p+ ions, a laser annealing process may be performed on the backside of the backside illuminated image sensor wafer 600.

Figure 11:
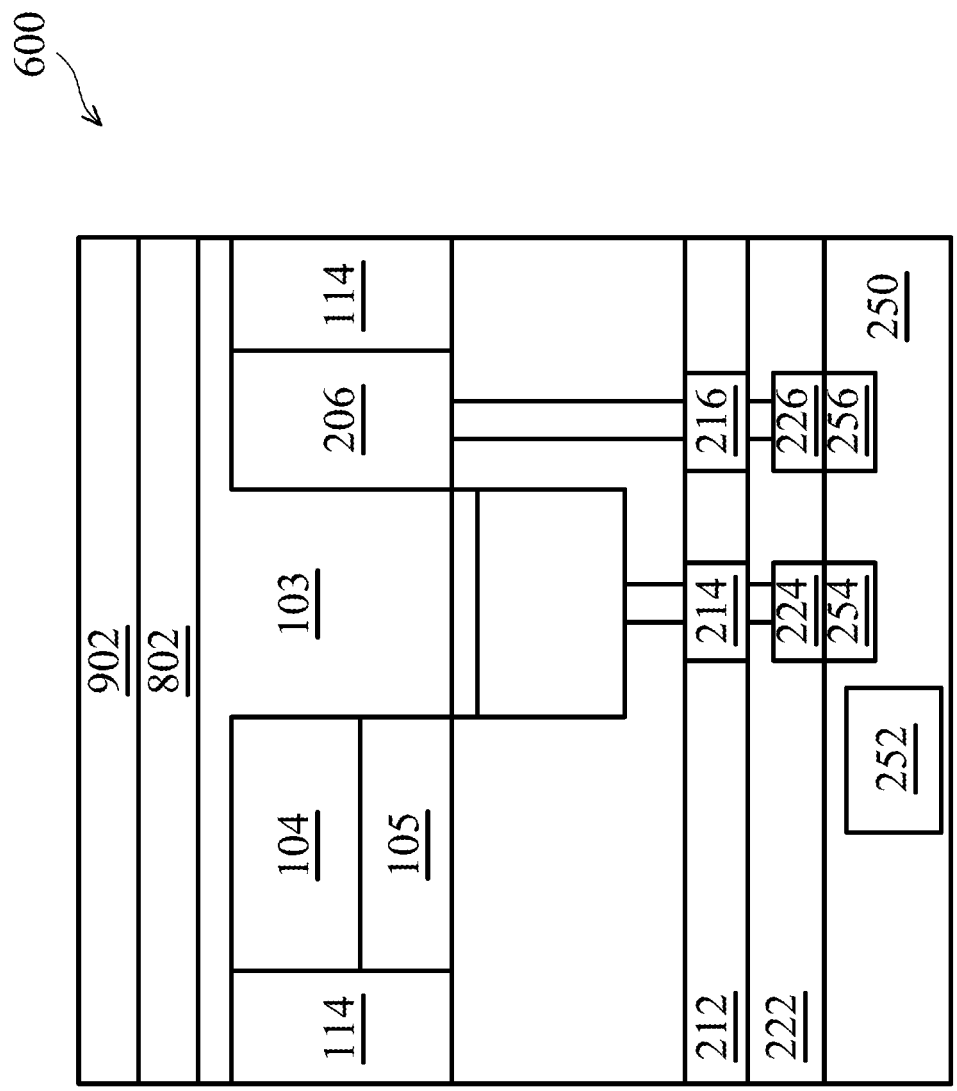
FIG. 11 is a cross sectional view of the backside illuminated image sensor wafer illustrated in FIG. 10 after a color filter layer has been applied in accordance with an embodiment.

FIG. 11 is a cross sectional view of the backside illuminated image sensor wafer illustrated in FIG. 10 after a color filter layer has been applied in accordance with an embodiment. The color filter layer 902 may be used to allow specific wavelengths of light to pass while reflecting other wavelengths, thereby allowing the image sensor to determine the color of the light being received by the photo active region 104. The color filter layer 902 may vary, such as a red, green, and blue filter. Other combinations, such as cyan, yellow, and magenta, may also be used. The number of different colors of the color filters 902 may also vary.

In accordance with an embodiment, the color filter layer 902 may comprise a pigmented or dyed material, such as an acrylic. For example, polymethyl-methacrylate (PMMA) or polyglycidylmethacrylate (PGMS) are suitable materials with which a pigment or dye may be added to form the color filter layer 902. Other materials, however, may be used. The color filter layer 902 may be formed by any suitable method known in the art.

Figure 12:
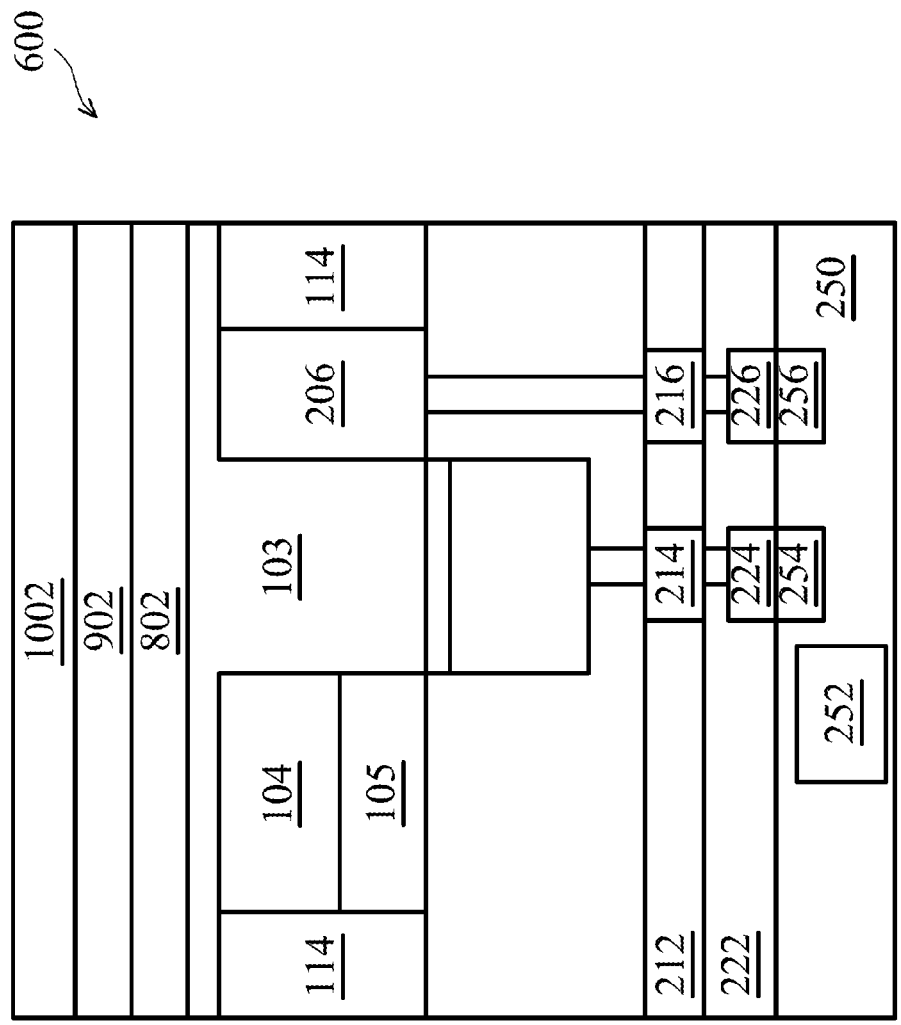
FIG. 12 is a cross sectional view of the backside illuminated image sensor wafer illustrated in FIG. 11 after a mircolens layer has been applied in accordance with an embodiment.

FIG. 12 is a cross sectional view of the backside illuminated image sensor wafer illustrated in FIG. 11 after a mircolens layer has been applied in accordance with an embodiment. The microlens layer 1002 may be formed of any material that may be patterned and formed into lenses, such as a high transmittance, acrylic polymer. The microlens layer 1002 is about 0.1 um to about 2.5 um in thickness. In accordance with an embodiment, the microlens layer 1002 may be formed using a material in a liquid state and spin-on techniques known in the art. This method has been found to produce a substantially planar surface and a microlens layer 1002 having a substantially uniform thickness, thereby providing greater uniformity in the microlenses. Other methods, such as deposition techniques like chemical vapor deposition (CVD), physical vapor deposition (PVD), or the like, may also be used.

Figure 13:
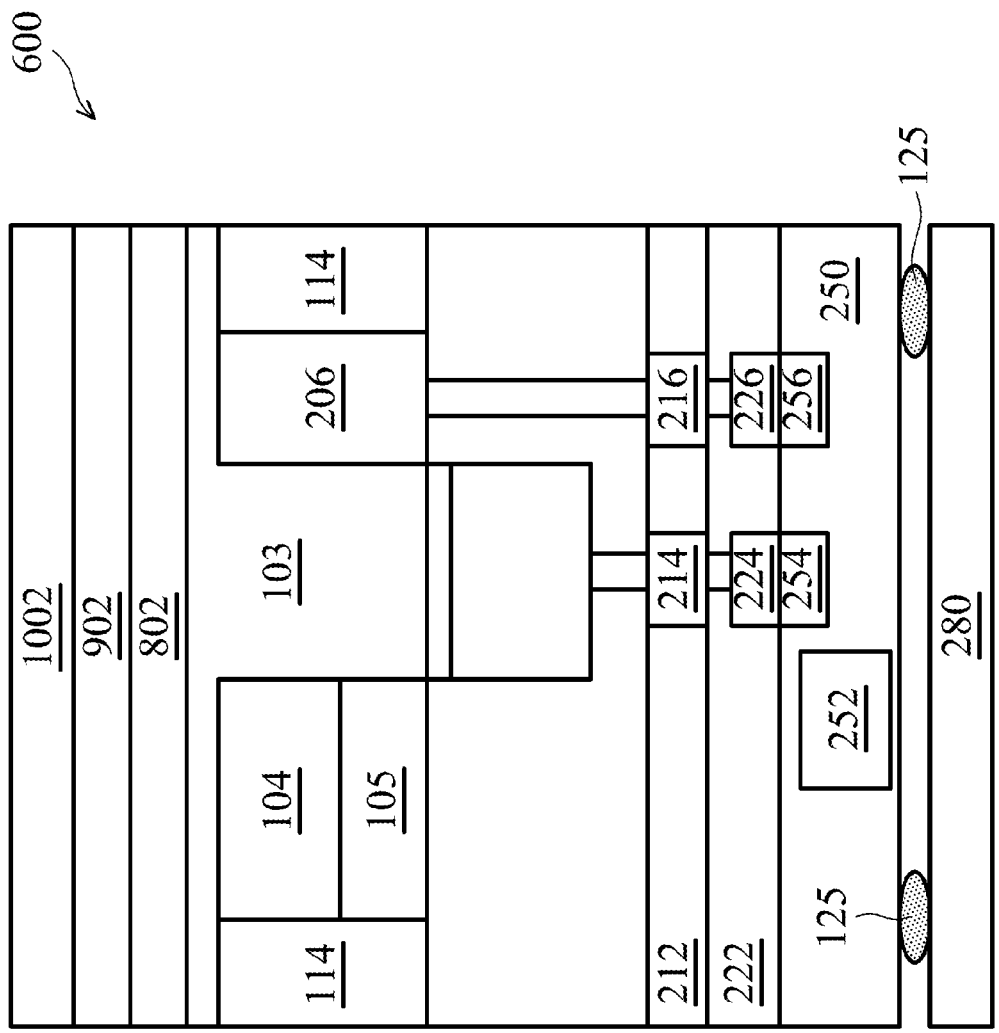
FIG. 13 illustrates a method of fabricating the backside illuminated image sensor shown in FIG. 3 in accordance with an embodiment.
Figure 14:
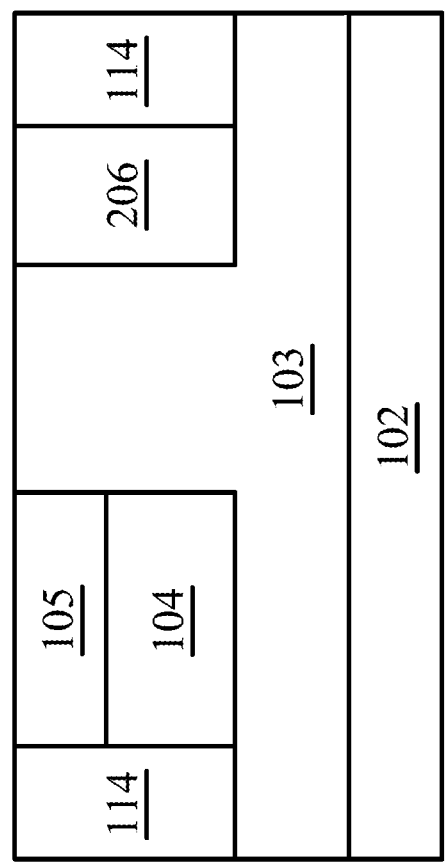
FIGS. 14-21 illustrate another method of fabricating the backside illuminated image sensor shown in FIG. 3 in accordance with an embodiment.
Figure 15:
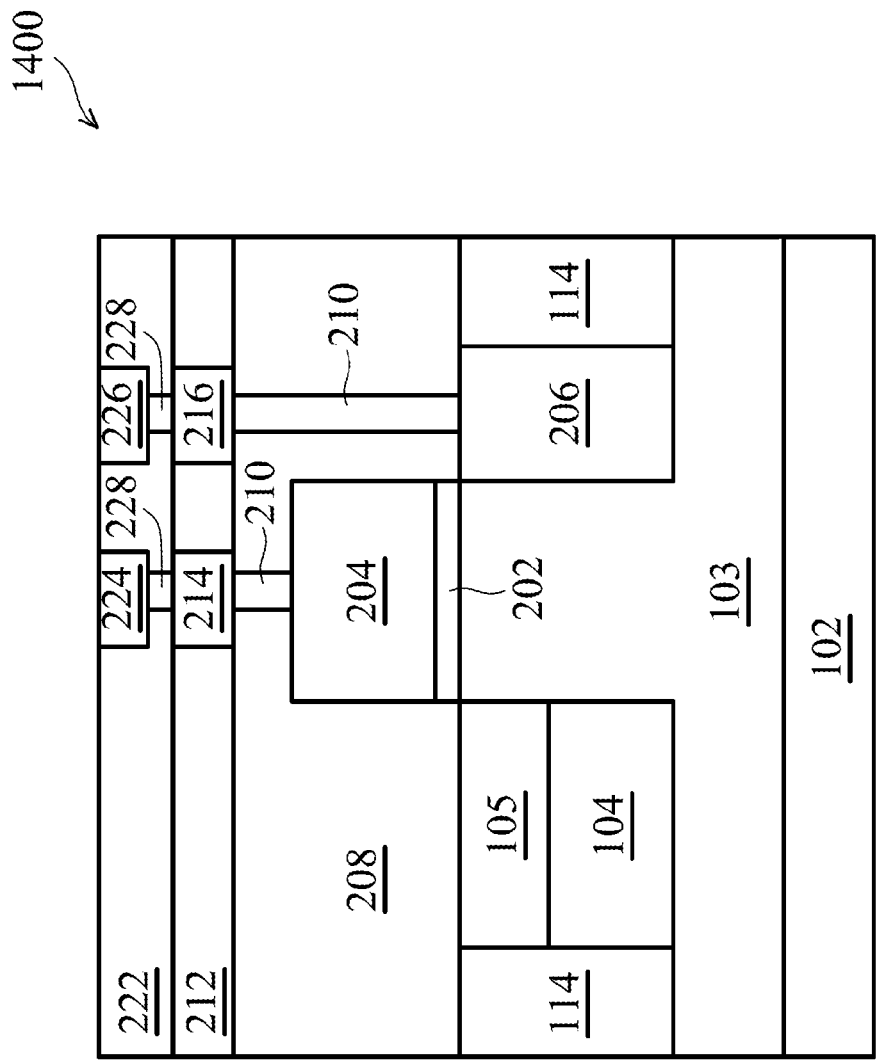
Figure 16:
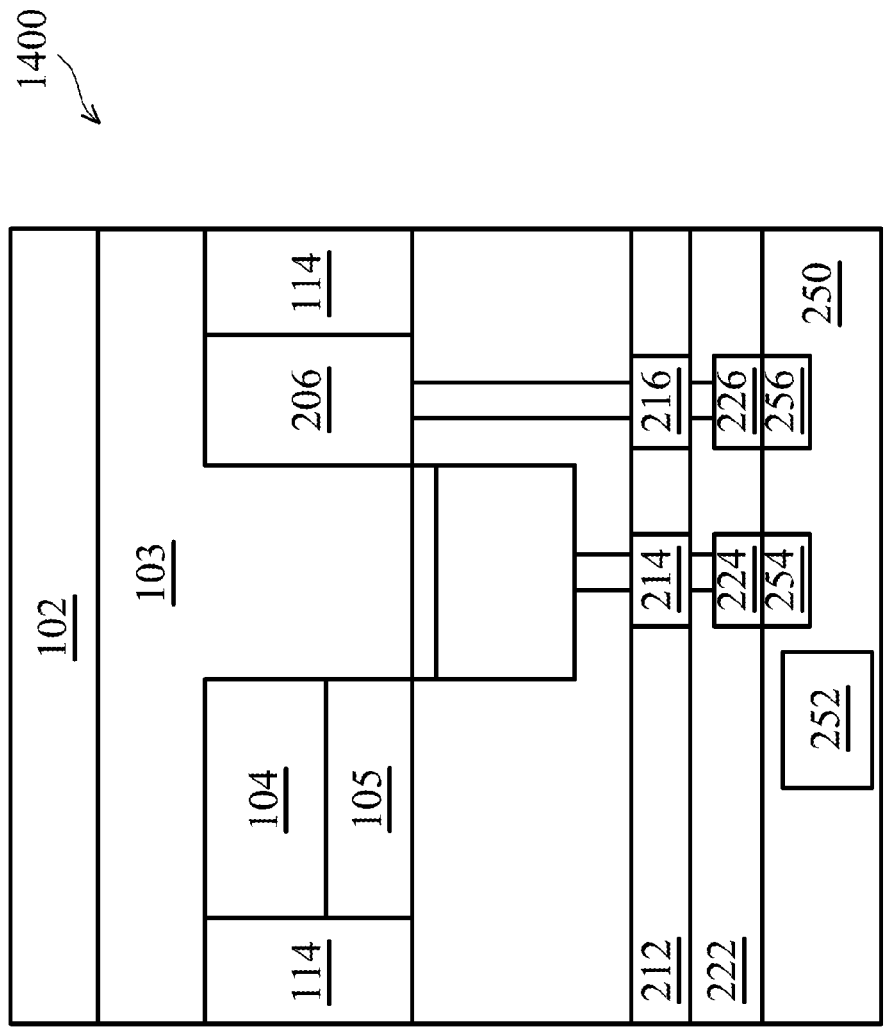
Figure 17:
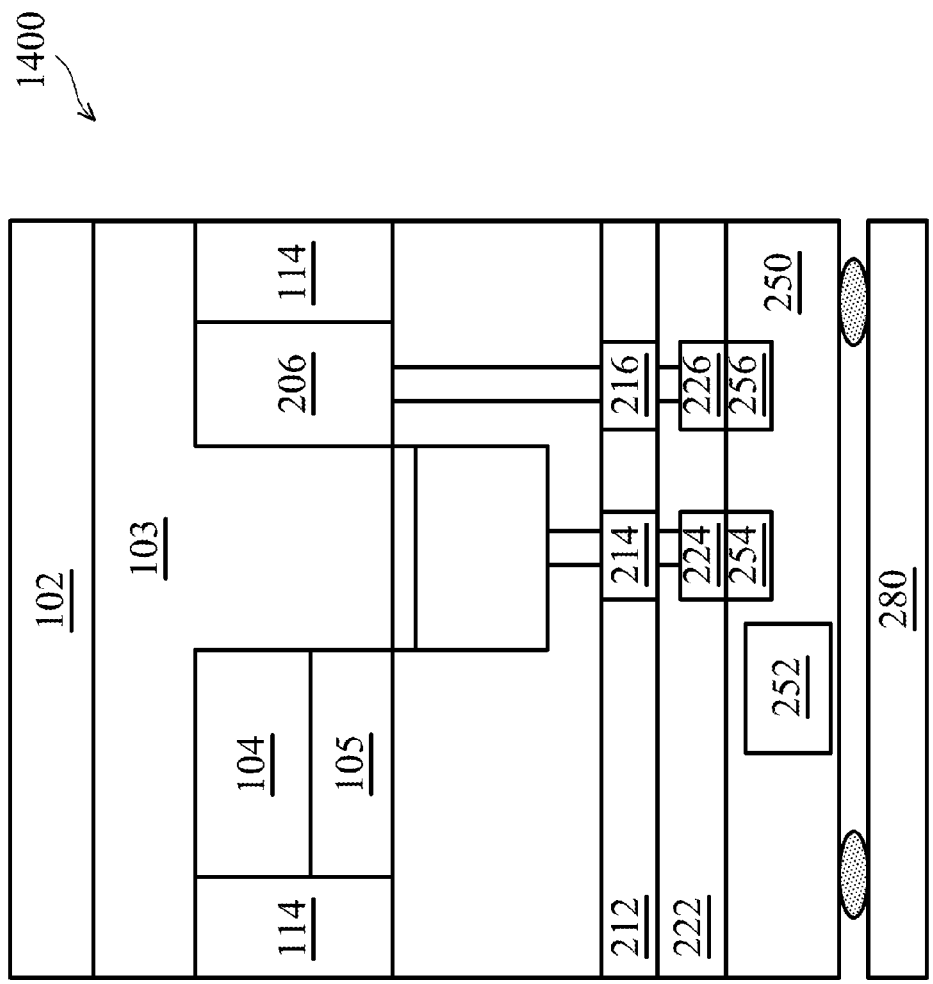
Figure 18:
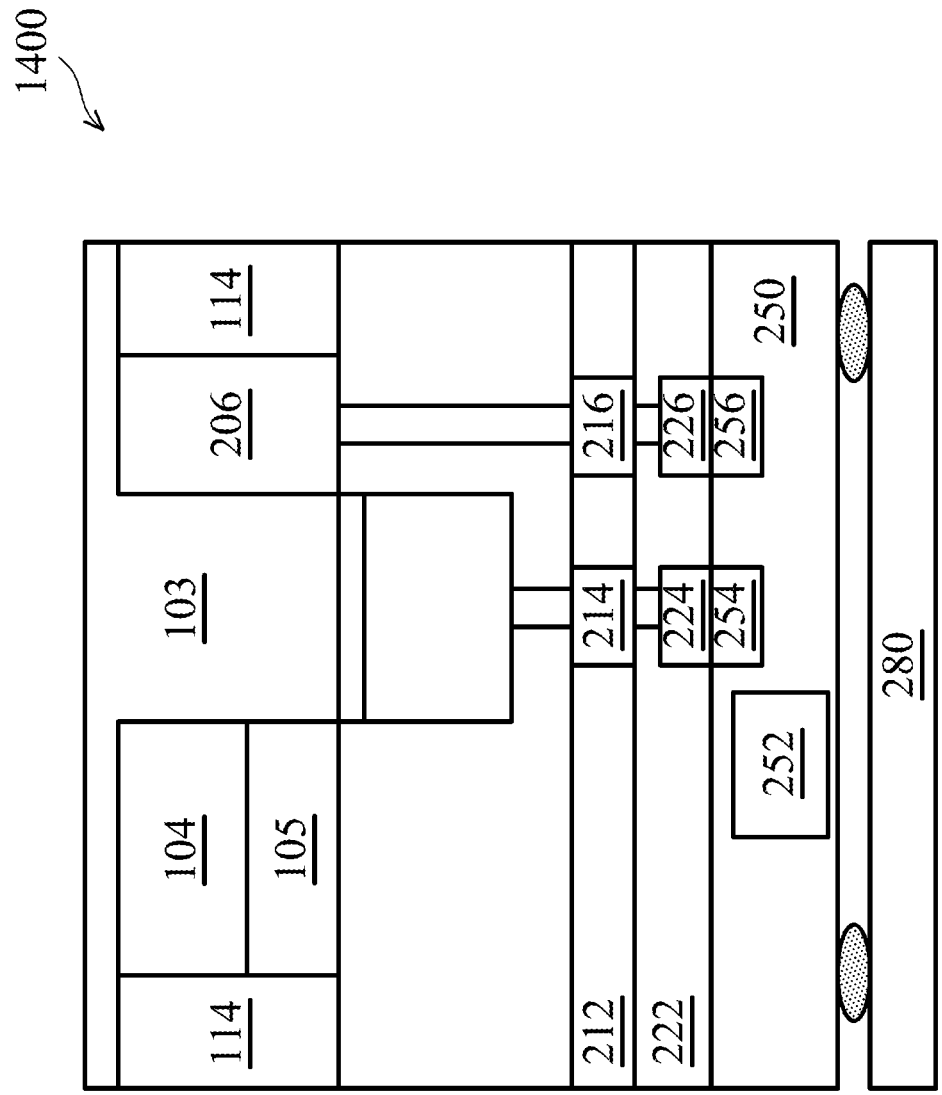
Figure 19:
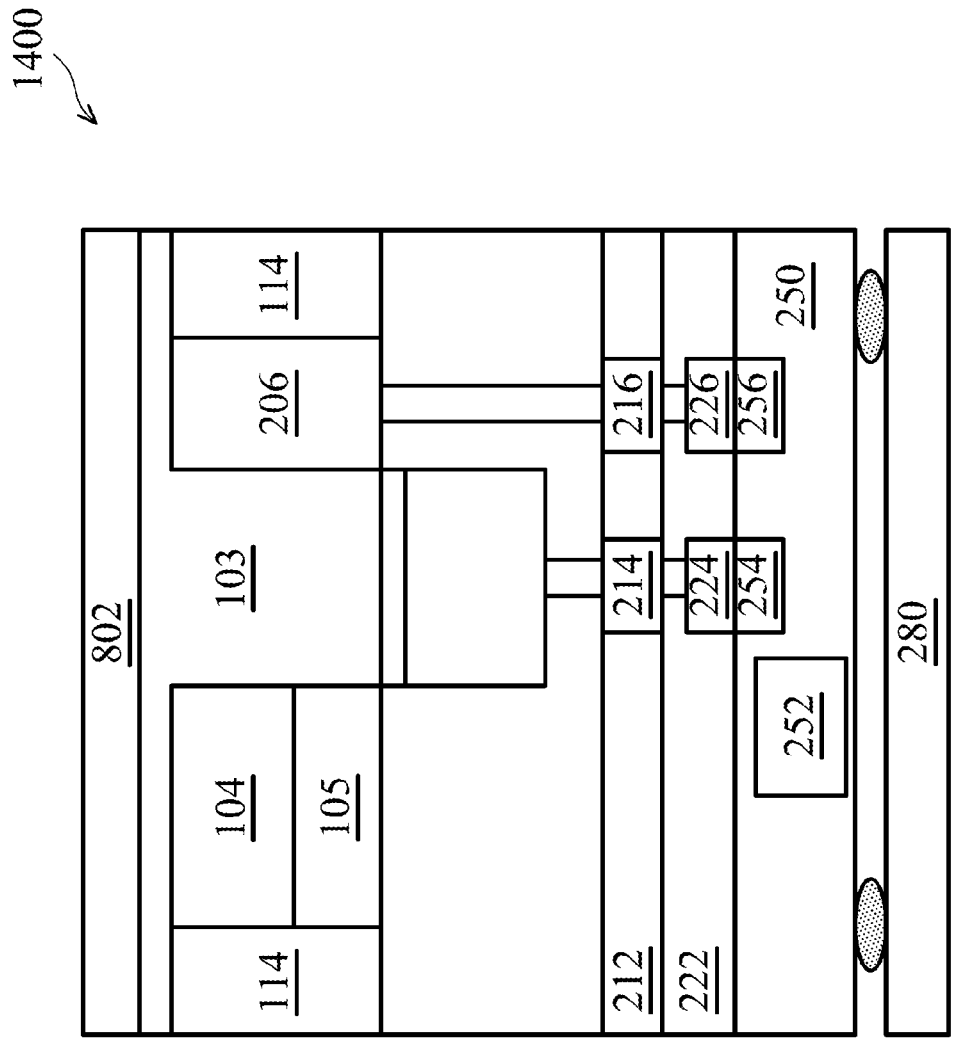
Figure 20:
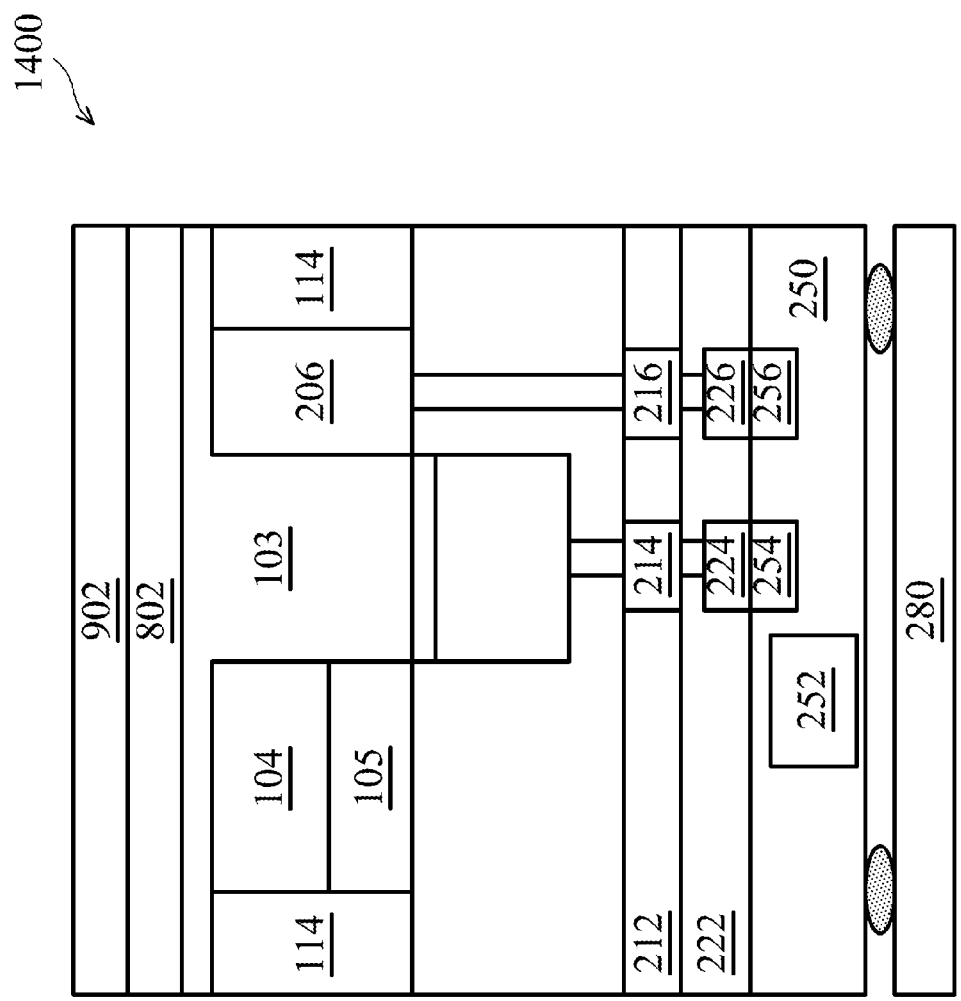
Figure 21:
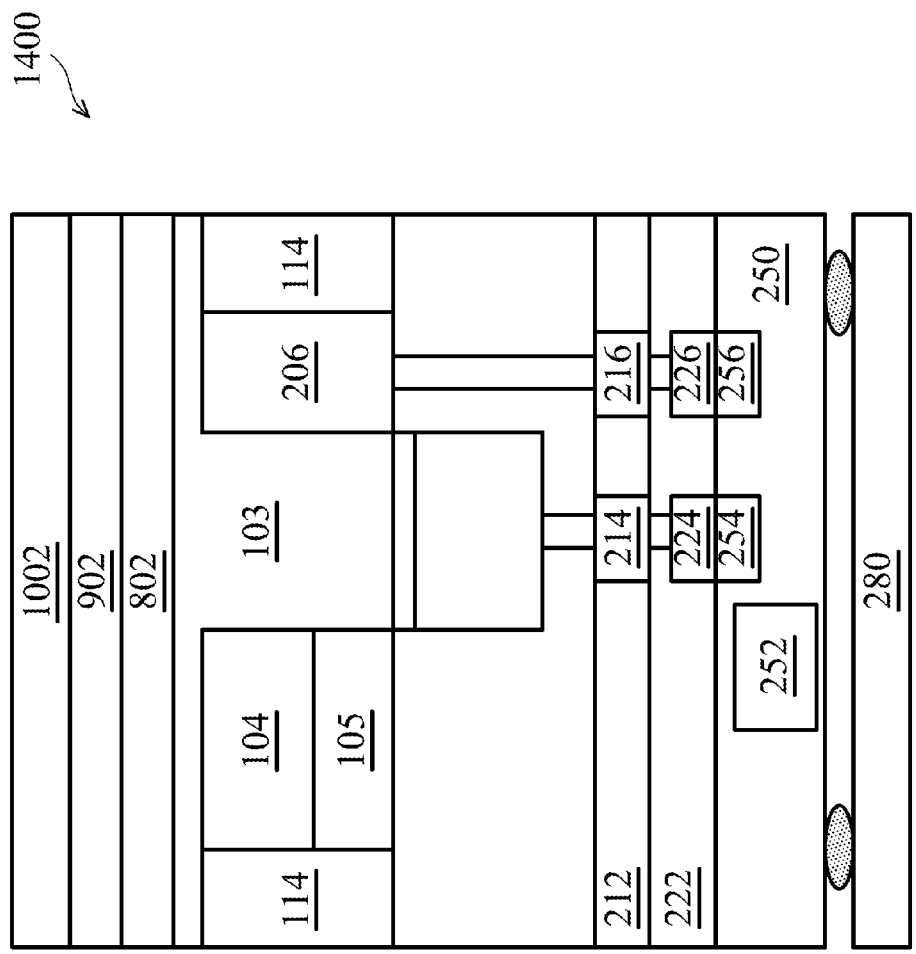

FIG. 13 illustrates a method of fabricating the backside illuminated image sensor 300 shown in FIG. 3 in accordance with an embodiment. Referring back to FIG. 12, after the backside illuminated sensor 600 is formed by bonding the first wafer and the second wafer together through direct bonding. A third wafer 280 can be bonded on the second wafer through a plurality of interconnect components 125. In accordance with an embodiment, the interconnect components 125 are a plurality of micro bumps formed between the second wafer and the third wafer.

FIGS. 14-21 illustrate another method of fabricating the backside illuminated image sensor 300 shown in FIG. 3 in accordance with an embodiment. FIGS. 14-21 are similar to FIGS. 6-12 except that a third wafer 280 is bonded on the second wafer in FIG. 17 prior to the backside thinning process shown in FIG. 18. The other processes such as the front side ion implantation, the front side interconnect layer formation, the thinning process have been described with respect to FIGS. 6-12, and hence are not discuss again to avoid unnecessary repetition.

Figure 22:
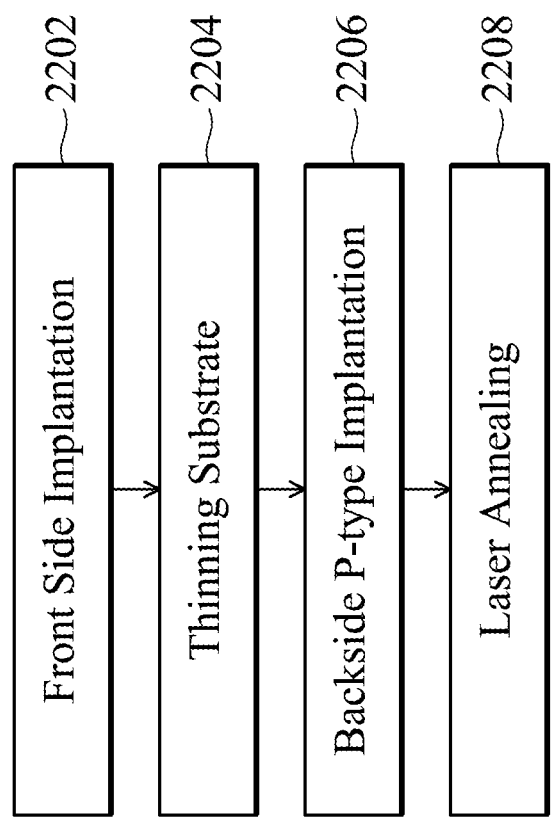
FIG. 22 illustrates a flow chart of a method for forming a backside illuminated image sensor in accordance with an embodiment.

FIG. 22 illustrates a flow chart of a method for forming a backside illuminated image sensor in accordance with an embodiment. At step 2202, a front side implantation process is applied to a CMOS image sensor wafer to form various doped regions such as photo active regions and isolation regions. In accordance with an embodiment, the photo active region may be of a depth of about 2 um.

At step 2204, the CMOS image sensor wafer is flipped and bonded on a carrier, wherein the carrier comprises logic circuits for a COMS image sensor. According to the fabrication process of a backside illuminated image sensor wafer, a substrate thinning process is performed on the backside of the substrate so that the thickness of the substrate is reduced to about 2 um in thickness. Such a thinned substrate helps to allow light to propagate from the backside of the substrate.

At step 2206, through an ion implantation process, a thin p+ ion layer may be formed on the thinned substrate to improve quantum efficiency. In accordance with an embodiment, the thin p+ ion layer has a thickness in a range from about 100 Å to about 1 um. At step 2208, a laser annealing process is performed on the backside of the substrate to repair defects due to the p+ ion implantation and activate p+ ions.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
providing a first chip comprising a photo active region and a first transistor of an image sensor coupled to the photo active region;
forming a first bonding pad on a first side of the first chip, wherein the first bonding pad is embedded in the first chip;
providing a second chip comprising:
  a second transistor of the image sensor, wherein the second transistor has a terminal directly coupled to a terminal of the first transistor;
  a second bonding pad on a first side of the second chip; and
  an input/output terminal on a second side of the second chip;
stacking the first chip on the second chip, wherein the first bonding pad is aligned with the second bonding pad; and
bonding the first chip and the second chip, wherein:
  the first bonding pad on the first side of the first chip is electrically coupled to the second bonding pad on the first side of the second chip;
  the input/output terminal is coupled to the first chip through a first through via and a second through via embedded in the second chip, and wherein a bottom surface of the input/output terminal is in direct contact with a top surface of the first through via, and a bottom surface of the first through via is in direct contact with a first side of a metal line, and a second side of the metal line is in direct contact with the second through via; and
  the first transistor of the image sensor is electrically coupled to the second transistor of the image sensor.

2. The method of claim 1, further comprising:
forming a third bonding pad on the first side of the second chip, wherein the third bonding pad is coupled to a logic circuit of the second chip; and
forming a fourth bonding pad on the first side of the first chip, wherein the fourth bonding pad is electrically coupled to the third bonding pad after the step of bonding the first chip and the second chip.

3. The method of claim 1, wherein the input/output terminal is an aluminum copper pad.

4. The method of claim 1, further comprising:
after the step of bonding the first chip and the second chip, thinning a second side of the first chip to a first thickness.

5. The method of claim 4, wherein the first thickness is in a range from about 2 um to about 2.15 um.

6. The method of claim 4, further comprising:
bonding a third chip on top of the second chip through a plurality of interconnect components, wherein the third chip comprises a logic circuit.

7. The method of claim 6, wherein:
the first chip comprises a transfer transistor of the image sensor;
the second chip comprises a reset transistor, a select transistor and a source follower of the image sensor; and
the third chip comprises the logic circuit coupled to a four-transistor image sensor circuit formed by the transfer transistor, the reset transistor, the select transistor and the source follower.

8. The method of claim 1, further comprising:
growing an epitaxial layer on a substrate with a first conductivity;
implanting ions with a second conductivity in the epitaxial layer to form a first photo active region;

implanting ions with the first conductivity in the epitaxial layer to form a second photo active region; and thinning a backside of the substrate until the epitaxial layer is exposed.

9. A method comprising:

providing a backside illuminated image sensor chip comprising a first transistor adjacent to a first side of the backside illuminated image sensor chip, a first bonding pad formed in the first side of the backside illuminated image sensor chip and a photo active region adjacent to a second side of the backside illuminated image sensor chip, wherein the first bonding pad is embedded in the backside illuminated image sensor chip;

providing a second chip comprising a second transistor, an input/output pad formed on a second side of the second chip and a second bonding pad formed in a first side of the second chip, wherein the second transistor has a terminal directly coupled to a terminal of the first transistor; and face-to-face bonding the second chip on the backside illuminated image sensor chip to form a stacked chip, wherein the first bonding pad is electrically coupled to the second bonding pad, and wherein the input/output pad and the photo active region are on opposing sides of the stacked chip, wherein the input/output pad is coupled to the backside illuminated image sensor chip through a first through via and a second through via embedded in the second chip, and wherein a bottom surface of the input/output pad is in direct contact with a top surface of the first through via, and a bottom surface of the first through via is in direct contact with a first side of a metal line, and a second side of the metal line is in direct contact with the second through via.

10. The method of claim 9, further comprising:

forming a p+ layer on the second side of the backside illuminated image sensor chip;

depositing a color filter layer over the p+ layer; and depositing a microlens layer formed over the color filter layer.

11. The method of claim 9, further comprising:

bonding a third chip on the second chip.

12. The method of claim 11, wherein:

the third chip comprises a logic circuit coupled to the second transistor of the second chip.

13. The method of claim 9, further comprising:

coupling the first transistor of the backside illuminated image sensor chip to the second transistor of the second chip through the first bonding pad and the second bonding pad.

14. The method of claim 9, wherein:

the first transistor of the backside illuminated image sensor chip is a transfer transistor of a four-transistor backside illuminated image sensor.

15. The method of claim 9, wherein:

the second transistor of the second chip is a reset transistor of a four-transistor backside illuminated image sensor.

16. A method comprising:

providing a first chip comprising a photodiode, a first transistor and a first bonding pad, wherein:

the first bonding pad is formed in a first side of the first chip, wherein the first bonding pad is embedded in the first chip;

the photodiode is adjacent to a second side of the first chip; and the first transistor is coupled to the first bonding pad;

providing a second chip comprising a second transistor and a second bonding pad, wherein the second transistor has a terminal directly coupled to a terminal of the first transistor;

providing a third chip comprising a logic circuit and an input/output pad; and bonding the second chip on the first chip, wherein the second bonding pad is electrically coupled to the first bonding pad; and bonding the third chip on the second chip to form a stacked chip, wherein the logic circuit is coupled to the second transistor of the second chip through a plurality of interconnect components, and wherein the input/output pad and the photodiode are on opposing sides of the stacked chip, and wherein the input/output pad is coupled to the second chip through a through via in the third chip, and wherein a bottom surface of the input/output pad is in direct contact with a top surface of the through via, and a bottom surface of the through via is in direct contact with a metal line.

17. The method of claim 16, further comprising:

bonding the second chip on the first chip through a thermocompression process.

18. The method of claim 16, further comprising:

bonding the second chip on the first chip;

applying a thinning process to the second side of the first chip; and bonding the third chip on the second chip.

19. The method of claim 16, further comprising:

bonding the second chip on the first chip;

bonding the third chip on the second chip; and applying a thinning process to the second side of the first chip.

20. The method of claim 16, further comprising:

coupling the input/output pad to the logic circuit through a plurality of through vias formed in the third chip.

* * * * *